US005786582A

United States Patent [19]
Roustaei et al.

[11] Patent Number: 5,786,582
[45] Date of Patent: Jul. 28, 1998

[54] OPTICAL SCANNER FOR READING AND DECODING ONE- AND TWO-DIMENSIONAL SYMBOLOGIES AT VARIABLE DEPTHS OF FIELD

[75] Inventors: Alexander R. Roustaei, La Jolla; Donald Fisher, Valley Center, both of Calif.

[73] Assignee: Symbol Technologies, Inc., Holtsville, N.Y.

[21] Appl. No.: 569,728

[22] Filed: Dec. 8, 1995

Related U.S. Application Data

[63] Continuation-in-part of Ser. No. 363,985, Dec. 27, 1994, abandoned, which is a continuation of Ser. No. 59,322, May 7, 1993, abandoned, which is a continuation-in-part of Ser. No. 965,991, Oct. 23, 1992, Pat. No. 5,354,977, which is a continuation-in-part of Ser. No. 956,646, Oct. 2, 1992, Pat. No. 5,349,172, which is a continuation-in-part of Ser. No. 843,266, Feb. 27, 1992, Pat. No. 5,291,009, said Ser. No. 569,728, Dec. 8, 1995, is a continuation-in-part of Ser. No. 137,426, Oct. 18, 1993, Pat. No. 5,484,994, and a continuation-in-part of Ser. No. 444,387, May 19, 1995, abandoned, which is a continuation-in-part of Ser. No. 329,257, Oct. 26, 1994, abandoned.

[51] Int. Cl.$^6$ .................. G02B 26/08; G06K 7/10
[52] U.S. Cl. .................. 235/462; 235/472; 359/196
[58] Field of Search .................. 235/462, 472; 396/98, 103, 108; 359/196

[56] References Cited

U.S. PATENT DOCUMENTS

| 3,684,866 | 8/1972 | Jones | 235/61.111 |
|---|---|---|---|
| 3,819,938 | 6/1974 | Kornkrumpf et al. | 250/222 |
| 3,876,900 | 4/1975 | Amatsuka et al. | 313/510 |
| 4,115,703 | 9/1978 | Dobras | 250/568 |
| 4,306,147 | 12/1981 | Fukuyama et al. | 250/221 |
| 4,473,746 | 9/1984 | Edmonds | 250/216 |
| 4,542,528 | 9/1985 | Sanner et al. | 382/62 |
| 4,570,057 | 2/1986 | Chadima, Jr. et al. | 235/472 |

(List continued on next page.)

FOREIGN PATENT DOCUMENTS

| 2673738 | 9/1992 | France. |
|---|---|---|
| 59-35276 | 2/1984 | Japan. |
| 63-189981 | 8/1988 | Japan. |
| 3113581 | 5/1991 | Japan. |

OTHER PUBLICATIONS

"CCD Bar Code Scanner;" ZB-1000/2000 Plus Series, Zebex Industries, Inc., 1992 Zebex Catalog No. 920802.

"CCD Bar Code Handy Scanner Model BHS-6000 Series;" Nippondenso Co., LTD., Mar. 1992 brochure.

(List continued on next page.)

Primary Examiner—Donald T. Hajec
Assistant Examiner—Douglas X. Rodriguez
Attorney, Agent, or Firm—Brown, Martin, Haller & McClain

[57] ABSTRACT

An optical device for reading one- and two-dimensional symbologies at variable depths of field, the device including a light source for projecting an emitted light towards the two-dimensional image and an optical assembly, or zoom lens, with dual field of view capability for focusing light reflected from the framed symbology onto a CCD detector for detecting the focussed light and generating a signal therefrom. The dual field of view capability enables scanning of both wide and narrow fields of view. An apodizing filter is provided within the optical assembly to increase depth of field. Aiming of the sensor to read the symbology is facilitated by a frame locator including a laser diode which emits a beam that is modified by optics, including diffractive optics, to divide the beam into beamlets having a spacing therebetween that expands to match the dimensions of the field of view of the sensor, forming points of light at the target to define the edges of the field of view. One or two sets of diffractive optics may be provided, with one set corresponding to each position, for each of the dual field of view positions of the zoom lens.

5 Claims, 18 Drawing Sheets

U.S. PATENT DOCUMENTS

| | | | |
|---|---|---|---|
| 4,578,571 | 3/1986 | Williams | 235/472 |
| 4,647,766 | 3/1987 | Dimur et al. | 250/227 |
| 4,743,773 | 5/1988 | Katana et al. | 250/566 |
| 4,758,717 | 7/1988 | Shepard et al. | 235/472 |
| 4,804,949 | 2/1989 | Faulkerson | 340/710 |
| 4,818,847 | 4/1989 | Hara et al. | 235/455 |
| 4,841,132 | 6/1989 | Kajitani et al. | 235/472 |
| 4,850,009 | 7/1989 | Zook et al. | 379/96 |
| 4,900,907 | 2/1990 | Matusima et al. | 235/472 |
| 5,001,509 | 3/1991 | Hamada et al. | 396/108 |
| 5,010,241 | 4/1991 | Butterworth | 235/462 |
| 5,070,352 | 12/1991 | Kotani et al. | 396/103 |
| 5,073,954 | 12/1991 | Van Tyne et al. | 382/18 |
| 5,107,100 | 4/1992 | Shepard et al. | 235/472 |
| 5,130,520 | 7/1992 | Shepard et al. | 235/472 |
| 5,132,525 | 7/1992 | Swartz et al. | 235/472 |
| 5,135,160 | 8/1992 | Tasaki | 235/462 |
| 5,138,358 | 8/1992 | Aoyama et al. | 396/98 |
| 5,187,356 | 2/1993 | Chadima, Jr. et al. | 235/472 |
| 5,192,856 | 3/1993 | Schaham | 235/472 |
| 5,196,684 | 3/1993 | Lum et al. | 235/462 |
| 5,202,784 | 4/1993 | Reddersen | 259/196 |
| 5,210,398 | 5/1993 | Metlisky | 235/462 |
| 5,264,956 | 11/1993 | Tzu-Chin | 359/196 |
| 5,268,580 | 12/1993 | He | 250/566 |
| 5,291,009 | 3/1994 | Roustaei | 235/472 |
| 5,302,812 | 4/1994 | Li et al. | 235/462 |
| 5,349,172 | 9/1994 | Roustaei | 235/472 |
| 5,354,977 | 10/1994 | Roustaei | 235/472 |

OTHER PUBLICATIONS

"Get A Head With Denso's Reading Edge Technology;" ID Systems, Apr. 1987, vol. 7, No.3.

"Information Encoding With Two–Dimensional Bar Codes," Theo Pavlidis, et al., Computer, vol. 25, No. 6, Jun. 1992, pp. 18–28.

"Automotive Industry Recommends 2–D Standards" —*Automotive I.D. News* By John Piatek. Aug. 1994, pp. 54–56.

"Paper Cuts: Highlights Of New Proceedings" —*OE/Reports*, Excerpts of SPIE Proceedings papers on the cutting edge of technology, Aug., 1994, By Tom Hopper, p. 6.

"CMOS In Camera"—Reprint from *IEE Review*, May 1994, By Oliver Vellacott, pp. 111–112.

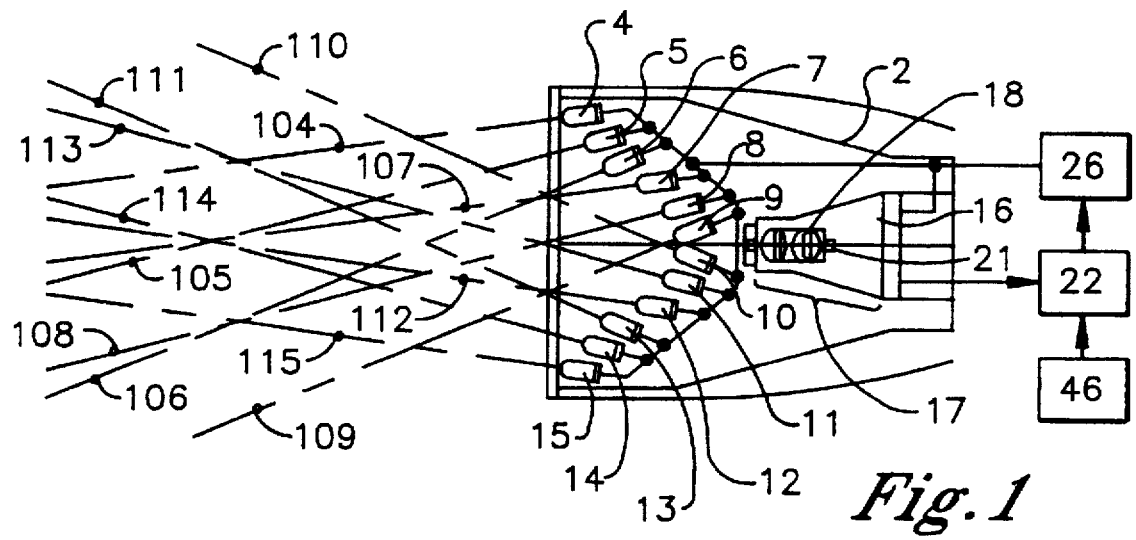
*Fig. 1*
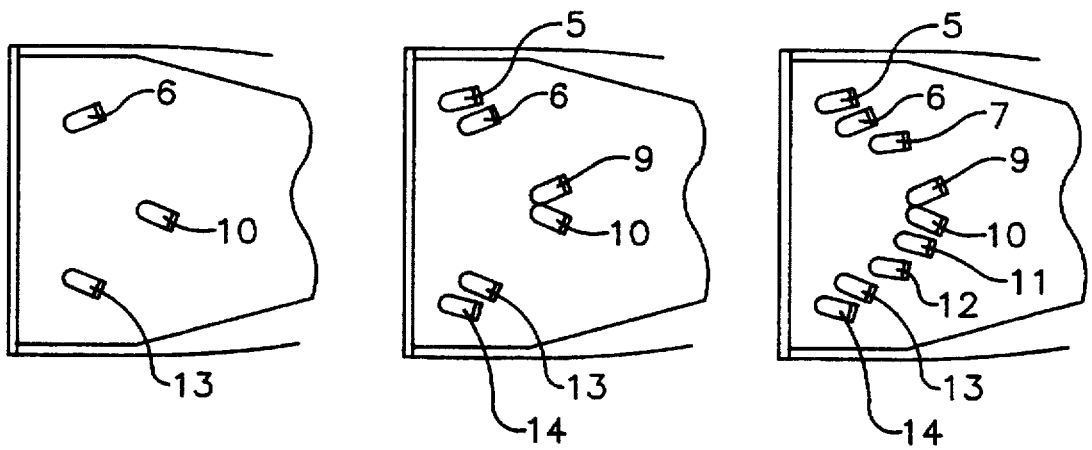
*Fig. 2A*  *Fig. 2B*  *Fig. 2C*
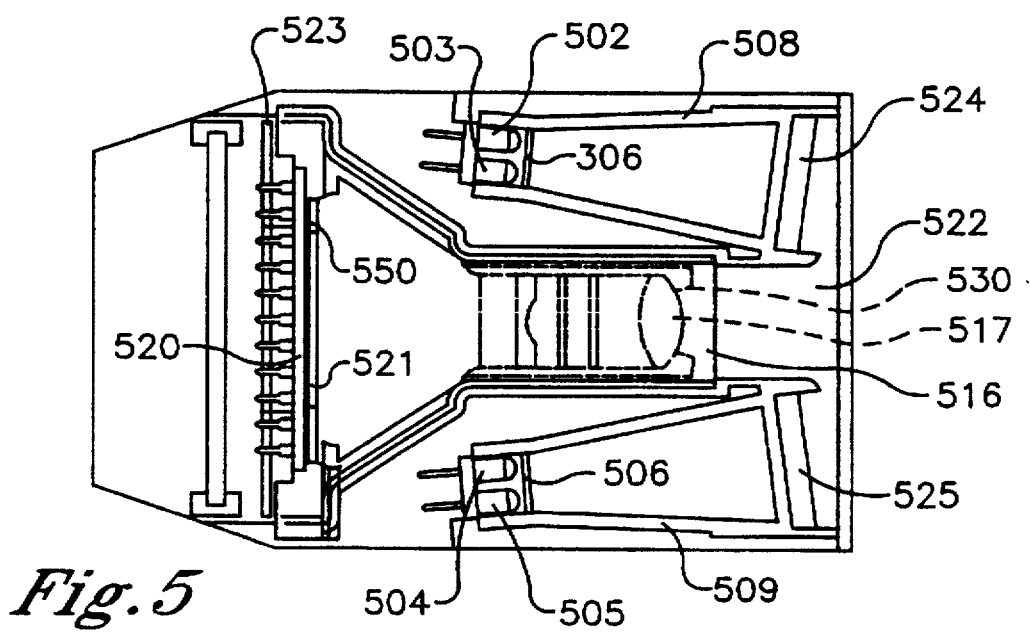
*Fig. 5*

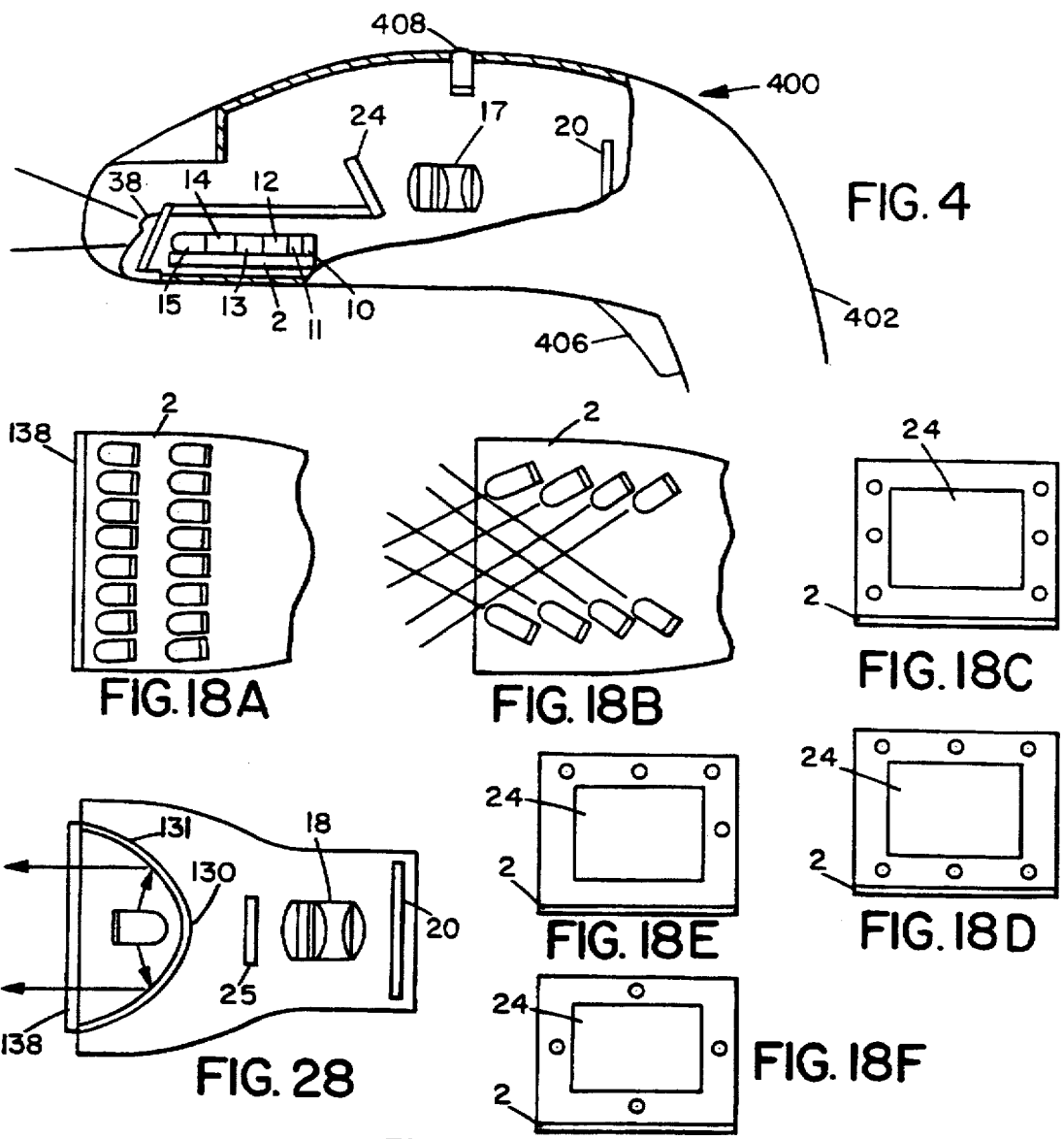
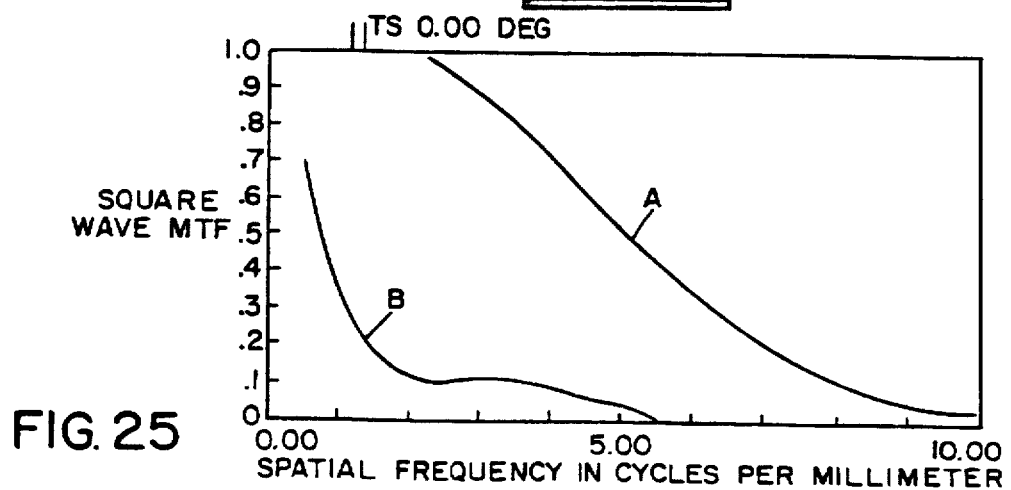

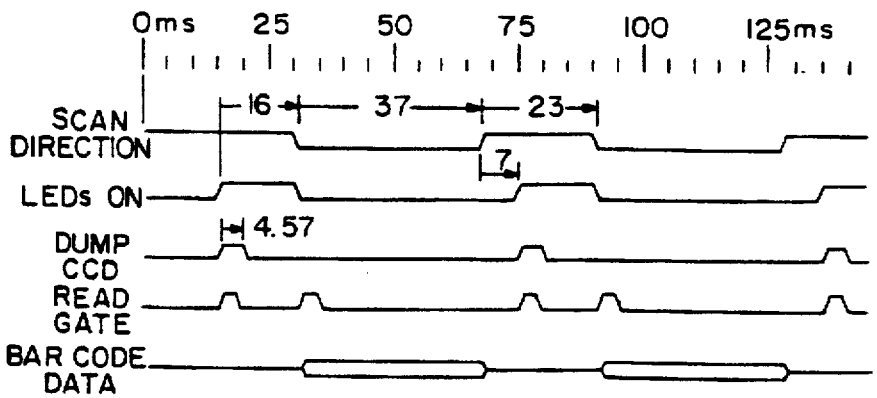
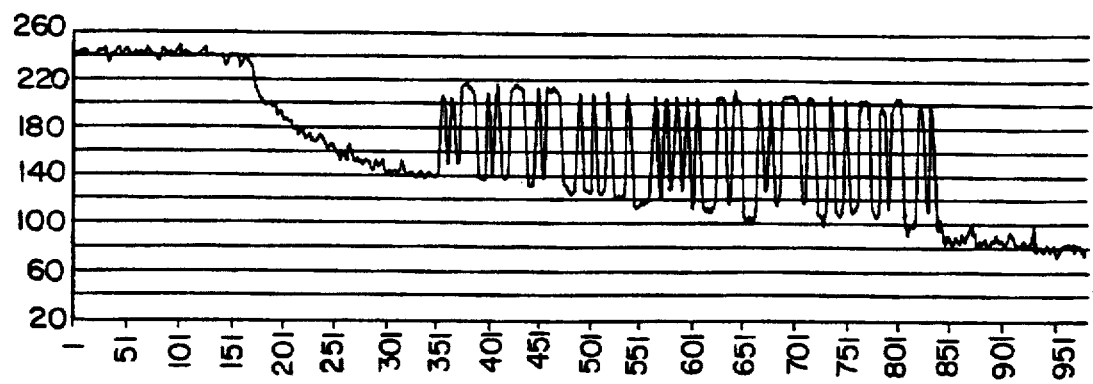
FIG. 30
FIG. 31

OPTICAL SCANNER FOR READING AND DECODING ONE- AND TWO-DIMENSIONAL SYMBOLOGIES AT VARIABLE DEPTHS OF FIELD

This is a continuation-in-part of application Ser. No. 08/363,985, filed Dec. 27, 1994, now abandoned which is a continuation of Ser. No. 08/059,322, filed May 7, 1993, now abandoned which is a continuation-in-part of application Ser. No. 07/965,991, filed Oct. 23, 1992, now issued as U.S. Pat. No. 5,354,977, which is a continuation-in-part of application Ser. No. 07/956,646, filed Oct. 2, 1992, now issued as U.S. Pat. No. 5,349,172, which is a continuation-in-part of application Ser. No. 07/843,266, filed Feb. 27, 1992, now issued as U.S. Pat. No. 5,291,009. This is also a continuation-in-part of application Ser. No. 08/137,426, filed Oct. 18, 1993, now issued as U.S. Pat. No. 5,484,994 and a continuation-in-part of application Ser. No. 08/444,387, filed May 19, 1995, now abandoned which is a continuation-in-part of application Serial No. 08/329,257, filed Oct. 26, 1994 now abandoned.

FIELD OF THE INVENTION

The invention generally relates to a scanning system for reading and/or analyzing optically encoded symbols and more particularly to an improved CCD bar code reading device for grabbing one- and two-dimensional symbols and images.

BACKGROUND OF THE INVENTION

Many industries, including the assembly processing, grocery and food processing industries, utilize an identification system in which the products are marked with a bar code symbol consisting of a series of lines and spaces of varying widths, or other types of symbols consisting of series of contrasting markings. A number of different bar code readers and laser scanning systems have been developed to decode the symbol pattern to a multiple digit representation for inventory, production tracking, and for check out or sales purposes. Optical scanners are available in a variety of configurations, some of which are built into a fixed scanning station and others of which are portable. The portability of an optical scanning head provides a number of advantages, including the ability to inventory products on shelves and to track portable items such as files or small equipment. A number of these portable scanning heads incorporate laser diodes which permit the user to scan the bar code symbols at variable distances from the surface on which the bar code is imprinted. A disadvantage of laser scanners is that they are expensive to manufacture.

Another type of bar code scanner which can be incorporated into a portable system uses light emitting diodes (LED) as a light source and charge coupled devices (CCD) as detectors. This class of bar code scanners is generally known as "CCD scanners". CCD scanners record symbols by storing the image in a frame memory, which is then scanned electronically, or processed using software to convert the captured image into an output signal.

One type of such CCD scanner is disclosed in the earlier Roustaei patents, e.g., U.S. Pat. Nos. 5,291,009, 5,349,172, and 5,354,977. While CCD scanners have the advantage of being less expensive to manufacture, the scanners prior to Roustaei were limited to scanning the bar code by either contacting the surface on which the bar code is imprinted or maintaining a distance of no more than one and one-half inches away from the bar code, which creates a further limitation in that it cannot read a bar code any longer than the window or housing width of the scanning head. The CCD scanner disclosed in the '009 patent and its offspring introduced the ability to read symbologies which are wider than the physical width of the scanner housing at distances as much as twenty inches from the scanner. This added versatility to CCD scanners which previously were limited to contact and close range, now allowing the CCD scan engines to be incorporated in fixed scanner systems, such as are used at retail checkout counters.

Considerable attention has been directed toward the scanning of two-dimensional bar codes, which can store about 100 times more information in the same space occupied by a one-dimensional bar code. In two-dimensional bar codes, rows of lines and spaces are stacked upon each other. The codes are read by scanning a laser across each row in succession in a zig-zag pattern. A disadvantage of this technique is that it introduces the risk of loss of vertical synchrony. It also has the disadvantage of requiring a laser for illumination of the bar code, which makes the scanner more expensive.

In all types of optical codes, i.e., one-dimensional, two-dimensional and even three-dimensional (multi-color superimposed symbologies), the performance of the optical system should be optimized to provide the best possible resolution, signal-to-noise ratio, contrast and response. These and other parameters are controllable by selection of, and adjustments to, the optical components, e.g., lens system, the wavelength of illuminating light, the optical and electronic filtering, and the detector sensitivity.

SUMMARY OF THE INVENTION

It is an advantage of the present invention to provide an optical scanner for reading optically encoded symbols located at variable distances from the reading device using LED light sources and CCD detectors.

It is another advantage of the invention to provide an optical reading device which can capture in a single snapshot and decode one- and/or two-dimensional symbols and images.

Still another advantage of the present invention is to provide an optical reading device to decode optical symbols having a wide range of feature sizes.

Yet another advantage of the present invention is to provide an optical reading device which can read symbologies omnidirectionally.

In an exemplary embodiment, the optical scanning head comprises a one or more light emitting diodes (LEDs) mounted on each side of a printed circuit board to emit light at different angles, so that a diverging beam of light is created. To accomplish this, the LEDs may be oriented so that all LEDs are directed at some non-zero angle from a line perpendicular to the window through which the light is emitted. The number of LEDs can be varied depending on the intensity of light desired and the application. For example, a scan of a two-dimensional bar code may require more LEDs, generally in a double light arrangement, while a one-dimensional bar code needs only one row. A single scanning head can be made with the ability to select one-or two-dimensional scanning by including a trigger or other switching means which activates the appropriate number of LEDs. The LEDs can be arranged in a number of different groupings, such as in a "V"- or "U"-shape, or in single or parallel lines. In an alternate embodiment, the LED array can be replaced with a flash lamp, which provides more intense light for scanning at greater distances.

The optical module includes a light shield or "dark room" and a lens/filter assembly which provides control of the depth of focus of the scanner. The dark room isolates the optical module from the illumination LEDs and extends at least from the entry of the lens/filter assembly to the detector. The detector, made up of a CCD array, is mounted on the PCB at the focal plane of the lens/filter assembly and at the back of the dark room for detecting the light intensity in the reflected beam over a field of view across a bar code symbol. The portion of the dark room that extends between the lens assembly and the detector may have a plurality of baffles formed therein to capture scattered light generated by both the incoming light and by reflections from the front of the detector, preventing this scattered light from becoming noise at the detector. The magnification of the lens/filter assembly is optimized to completely fill the CCD array, allowing a wide range of depth of field. The CCD array may consist of a single linear arrangement, a double linear arrangement, or a matrix arrangement.

The imaging optics of the lens/filter assembly provide a dual field of view by changing its effective focal length. The imaging optics include a simple zoom lens comprising a group of three or four lenses, at least one of these lenses having means for movement relative to the other lenses. The dual field of view permits modification of both focal length and the width of the field of view. The zoom mechanism is a small motor or solenoid. The zoom lens is automatically operated at predetermined intervals to change the field of view. An apodizing filter with decreasing transmittance radially across the pupil may be added to the imaging optics to improve the depth of focus.

A light transmissive window is positioned in front of the LEDs for manipulating, homogenizing and/or focussing the light. The window may include a filter and/or anti-reflection coating.

The window may be configured to have a double radius for focussing at two different focal distances, and may be "knurled" or scalloped to homogenize the light. For optimum efficiency, the window is located at a distance in front of the LEDs coinciding with the greatest concentration of light. It may also include a holographic diffuser to homogenize the light.

The CCD detector array generates an electrical signal indicative of the detected intensity of the light reflected from the symbol or image. The captured image is stored in a frame memory as a signal which is conveyed to a signal converter consisting of an analog filter and analog-to-digital conversion circuitry to filter noise and digitize the analog signal to generate data descriptive of the bar code symbol. An automatic gain control, edge detection or highly-adaptive thresholding is provided to adjust the magnitude of the received signal to a pre-determined level, regardless of the distance between the bar code and the scanner and the ambient illumination. In an alternate embodiment, the output of the CCD array will be fed to the input of the A/D converter. The reference voltages in the A/D converter will be selected to maximize the full scale range of the A/D for the offset voltage from the CCD. The reference voltage $V_{REF}$ for the A/D may be programmable to maximize the sensitivity for low light level situations. The output of the A/D converter will be latched for reading by the microprocessor, so the output value may be read while the next conversion is in progress. Each of these techniques look, in effect, at the slope of the waveform produced when a bar code is scanned (while the ideal signal would be a set of rectangular pulses, the real signal has a rounded form because of the convolution distortion). However, using an appropriate optical model for selecting the optical system components, the effects of distortion of the square wave signal can be minimized.

The optical scanning head is powered by a DC source or battery, preferably rechargeable, which provides DC voltage to the LEDs and CCD detector in response to a clocked signal which is provided by a drive clock sequencer and synchronization module. The timing signal can control a gradual, serial illumination of the LEDs and controls and coordinates the activation of the CCD detector in order to minimize power consumption during scans. Alternatively, the voltage supplied to the LEDs can be modulated in response to the level of the signal produced by the CCD detector. If an optical symbol is scanned at close range, a lower level of light will provide a strong signal. However, at greater distances from the symbology, higher light intensity may be necessary to achieve a good quality signal at the CCD detector. Power is conserved in the latter version by not providing full power to the LEDs, detector or processing hardware unless necessary.

An aiming or spotting beam consisting of a coherent or incoherent light source with its own optics may be provided to assist the user to capture the image in the detector. The aiming light source comprises a high purity light so that it is easily discernable from both ambient light and the illumination light provided by the LEDs. Diffractive or similar optics are used to create multiple light spots at the target to define the corners and/or edges of the field of view. In the dual field of view (FOV) embodiment, two separate sets of aiming optics are provided, one corresponding to each focus position.

Mathematical models are provided to assist in selection of appropriate optical components for optimizing performance of the optical scanner at a wide range of field depths and angles. The optical components are fixed in position relative to each other so that no position adjustments are required to obtain a reading at a desired distance once the optical components are optimized. Among the parameters that are considered are LEDs for emitting light within specific wavelength ranges, optical filters, lens focal lengths, magnification, etc. The Fourier transform of the input square wave signal is used to generate the appropriate resolution values. Selection of appropriate optical components is dependent upon the intended operation of the scanner. For example, depth of field is considered, as is scan angle and density of the code to be read. The mathematical models are based upon the modulation transfer function (MTF) of the optical system, calculation of which is generally known in the art.

BRIEF DESCRIPTION OF THE DRAWINGS

Understanding of the present invention will be facilitated by consideration of the following detailed description of a preferred embodiment of the present invention, taken in conjunction with the accompanying drawings, in which like reference numerals refer to like parts and in which:

FIG. 1 is a diagrammatic view of the relative layout of the LEDs, optical module, and detector on a printed circuit board;

FIGS. 2a, 2b and 2c are diagrammatic views of relative locations of LEDs for one trio, two trios and three trios of LEDs, respectively, in a first exemplary embodiment of the scanning head;

FIG. 4 is a side elevation, partially cut away, of an assembled optical scanning head including a housing;

FIG. 5 is a diagrammatic top view of a second exemplary embodiment of the scanning head;

FIGS. 7a through 7g are plots of clock pulses for different timing configurations with respect to activation of the scanner (FIG. 7a); alternate illumination cycles (FIGS. 7b, 7c and 7d) according to the present invention; analog reset of the detector (FIG. 7e); and illumination pattern according to prior art methods 1 and 2 (FIGS. 7f and 7g);

FIG. 25 is a plot of resolution at given distances from the scanning head;

FIG. 28 is a diagrammatic view of a single light source with a parabolic reflector;

FIGS. 29a through 29e are plots of the timing diagram configuration with respect to activation of the scanner, showing the scan direction (FIG. 29a); activation of the LEDs and the exposure time (FIG. 29b); dumping of the CCD (FIG. 29c); read gate time (FIG. 29d); and data (FIG. 29e);

FIG. 30 is a plot of the video output signal of the CCD;

FIG. 31 is a plot of the microprocessor output signal;

DETAILED DESCRIPTION OF THE PREFERRED EMBODIMENTS

Figure 17:
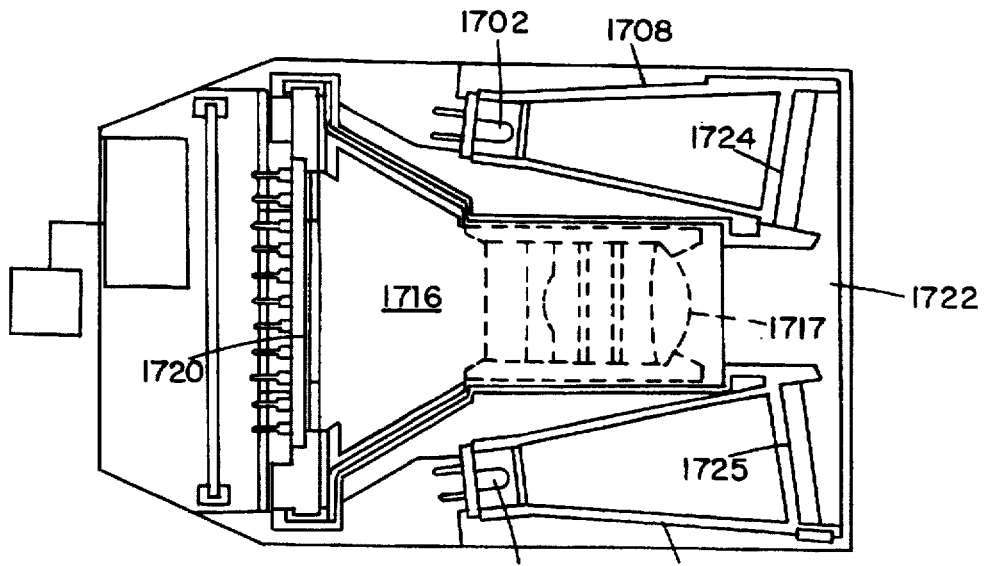
FIG. 17 is diagrammatic top view of a third exemplary embodiment of the scanning head.

The scanning head module illustrated in FIG. 1 comprises the printed circuit board (PCB) 2 configured as a generally "U"- or "Y"-shaped surface onto which is mounted a plurality of LEDs arranged in an orientation that results in projection of a light ray by each LED in a direction to create a diverging beam consisting of the combination of the light from all LEDs of the plurality. In the embodiment of FIG. 5, four LEDs (LEDs 502–505) are used, with two on either side of an optic module, and in the embodiment of FIG. 17, two LEDs (LEDs 1702 and 1704) are used. Forward of the LEDs is window/diffuser/lens 24 which is light transmissive and provides homogenization and focusing of the light path of the illuminating beam incident upon the bar code to be scanned. As illustrated in the embodiment of FIG. 5, a separate window 524, 525 can be provided for each side of the PCB, placed in front of the corresponding LED(s) on that side. Reflected light carrying the intensity modulated symbol is directed back to the optic module and to the detector. Similarly, for the embodiment of FIG. 17, separate windows 1724, 1725 are provided for each LED 1702, 1704.

The scanning head configuration illustrated in FIG. 1 has 12 LEDs mounted on the PCB 2 in a "V"-shape. These are identified as LEDs 4 through 15, which emanate rays of light 104 through 115. The portion of printed circuit board 2 from which LED light emanates will be considered the front of the board. A line of reference for describing the orientation angles of the LEDs runs perpendicular to the front of the PCB 2. At the approximate center of the board, behind the LEDs, an optical module 17 consisting of one or more light shields (dark room 16), in which is contained lens assembly 18 which filters and focuses light reflected from a scanned bar code onto CCD detector 20, is disposed behind the optical module at its focal plane. The detector 20 can be disposed directly on the PCB 2, or on a separate printed circuit board 523, mounted on and electrically connected to PCB 522, as shown for detector 520 in FIG. 5. A signal generated by activation of the CCDs by the reflected light is conveyed to signal converter 22 which consists of an analog filter and an analog-to-digital circuit.

The scanning head may also include a decoder module 26 which decodes a multiple-digit representation of bar code symbols such as UPC, EAN, JAN, Code 39, Code 2/51, Code 2/5, Code 128, Codabar, Plessey, and other optical encoding systems. (It should be noted that, while most optical encoding techniques of this nature are generically called "bar codes", some types of printed codes exist which may not be in the form of parallel bars. For example, a concentric target-type code is in use which involves alternating concentric rings of varying widths. The code systems that incorporate non-bar-type codes are also appropriate for measurement by the optical scanning system described herein and are considered to be included in the general category of bar codes for purposes of this description.) In some instances in the present disclosure, the images or symbols may be referred to as "optical symbols", which includes bar codes as well as other types of symbologies in which data is encoded and two-dimensional images.

A first exemplary embodiment of the light source illustrated in FIG. 1 consists of 12 LEDs which are mounted in a generally V-shaped configuration on the PCB 2 so that they point outward at angles such that groupings of three on a single leg, e.g. LEDs 4, 5 and 6 or 13, 14 and 15 form substantially a single beam of light which expands at increased field depth. An example of the groupings of the LEDs are illustrated in FIGS. 2a, b and c, showing 3, 6 and 9 LEDs respectively. The 12 LEDs shown in FIG. 1 are divided into groups of three, or trios, of LEDs. From this, and FIGS. 2a–2c, it can be seen that a given trio of LEDs is not determined by serial progression of the LED's location in the V-configuration, but rather that the combined illumination of the trio substantially fills the window 24 or exit opening and expands therefrom to form a fan of light to facilitate detection of bar codes which are wider than the window itself. This general principle is applied to any configuration of the LEDs, i.e., that the combined light of the LEDs substantially fills the window or exit opening and expands into an increasingly wider beam.

Figure 11:
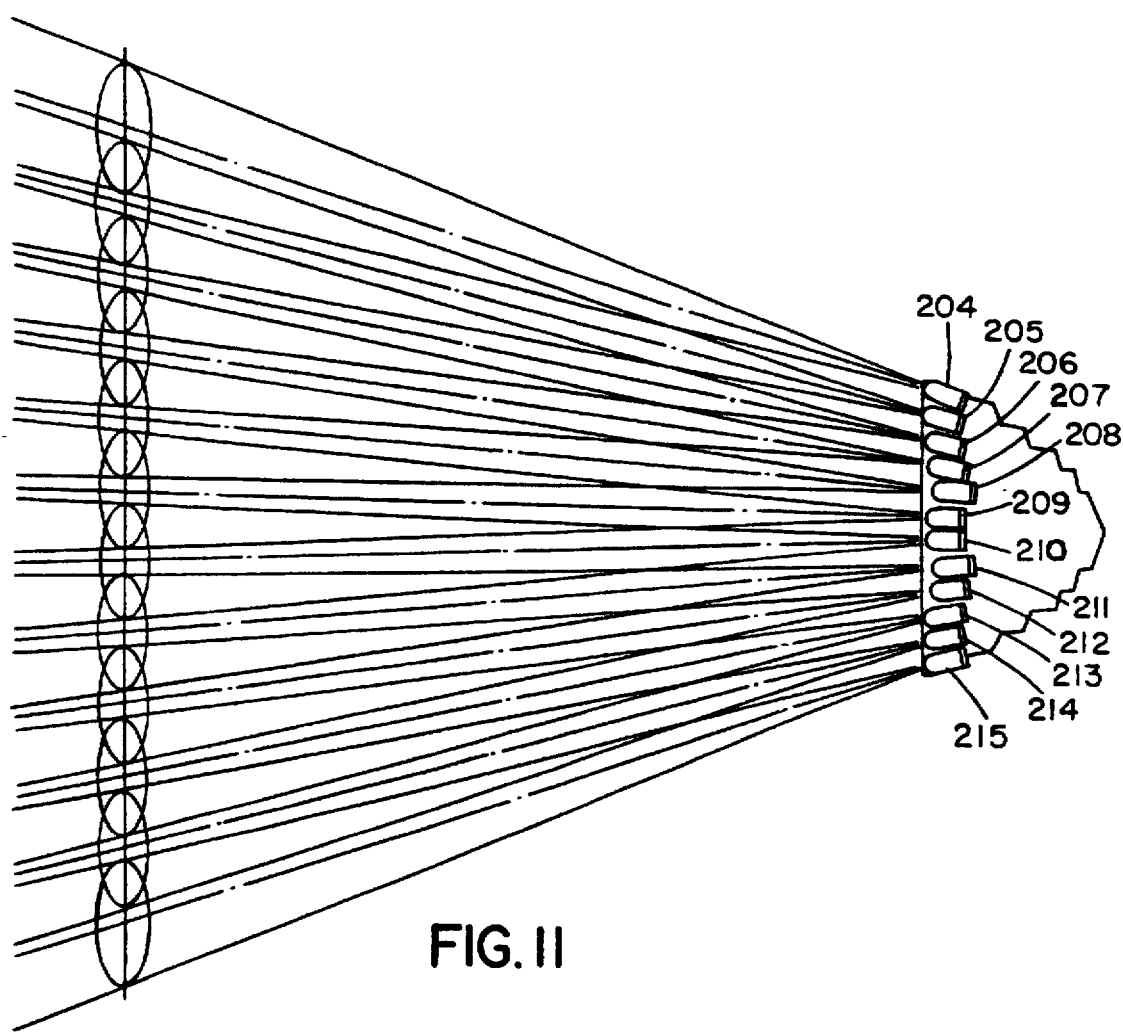
FIG. 11 is a diagrammatic view of a third alternate LED layout and its corresponding light distribution.
Figure 18G:
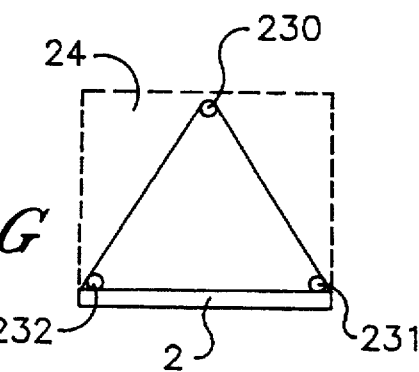
FIGS. 18a through 18g are diagrammatic views of LED orientation for two-dimensional scanning, parallel and perpendicular to the front of the printed circuit board, respectively.

Other alternate configurations for arrangement of the LEDs can be a "U"-shape or generally straight line across the front of the board, as illustrated in FIG. 11. For two-dimensional bar code scanning, the variations can include two linear rows of LEDs, parallel to the front of the PCB 2, or two linear rows of LEDs perpendicular to the front of the board, as illustrated in FIGS. 18a and 18b, respectively. Combinations of parallel and perpendicular rows may also be used. A multi-tiered arrangement can be used for positioning the LEDs, with, for example, one row above the other, as in FIG. 18c, or with two vertical rows extending upward from PCB 2, as in FIG. 18d, or any combination thereof. In FIG. 18e, a possible combination consists of one row of LEDs running across the upper row, and a single LED on one side, and in FIG. 18f, a single LED is located on each of four sides in a vertical plane. In FIG. 18g, the LEDs are configured in a vertical plane in a triangular distribution, with LEDs at each corner of the triangle. In this configuration, the upper LED 230 may be mounted on the upper interior wall of the housing and the lower LEDs 231,232 can be mounted directly on the PCB 2. In each case, the fan of light is created by orienting the LEDs so that they project their light at different angles to combine to create a divergent beam. In the straight line configuration of FIG. 11, the centermost LEDs 209 and 210 are turned to point away at an angle of 1.625 degrees from a line normal to the front of the board. Progressing outward, each LED is 3.25 degrees from the inner adjacent LED.

In the embodiment of FIG. 5, the LEDs are grouped in pairs 502–503, 504–505, and mounted on opposite sides of the PCB 522. A horizontal slit 506 is disposed in front of the LEDs to enhance beam uniformity. The combined beam of each LED pair is collected and redistributed by a single lens element 524, 525 to define a square region corresponding to the wide field of view with a uniform illumination profile. In the preferred embodiment, the single lens element is a diffractive optical element (DOE), although a holographic optical element (HOE) may also be used. The LED pairs and single lens elements are positioned to emit light so that the beam diverges at greater distances from the front of the scanning head.

Figure 32:
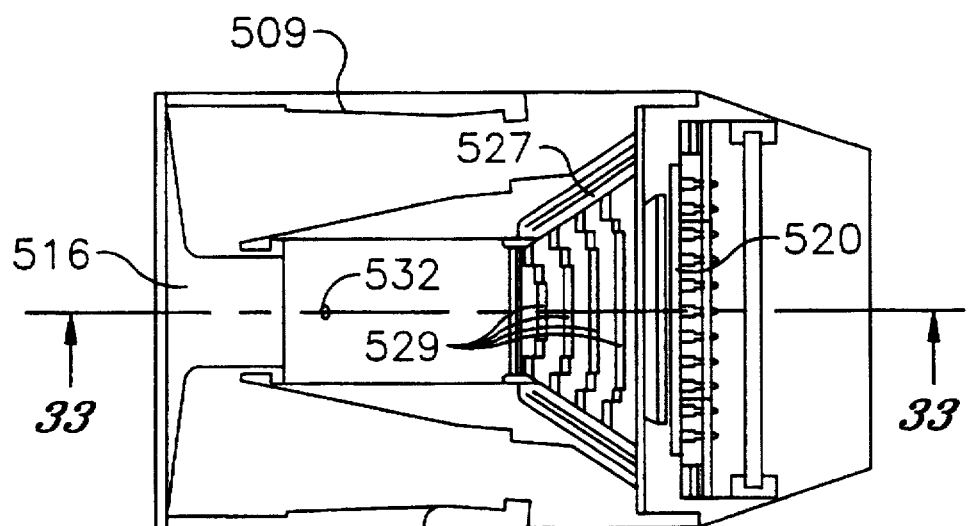
FIG. 32 is a diagrammatic view of the dark room assembly and baffles as mounted on the printed circuit board.

The LEDs 502–505, the slit 506 and the diffuser/lens 524 are all enclosed within a dark rooms 508 and 509, as shown in more detail in FIG. 32, which can either be separate from or integral with dark room 16 of the embodiment of FIG. 1 described below. If dark rooms 508 and 509 are formed integrally with dark room 516, as may be convenient for manufacturing purposes, they must be isolated from dark room 516 so that the light from the LEDs does not enter the enclosure surrounding the lens assembly 517 and detector 520.

Figure 33:
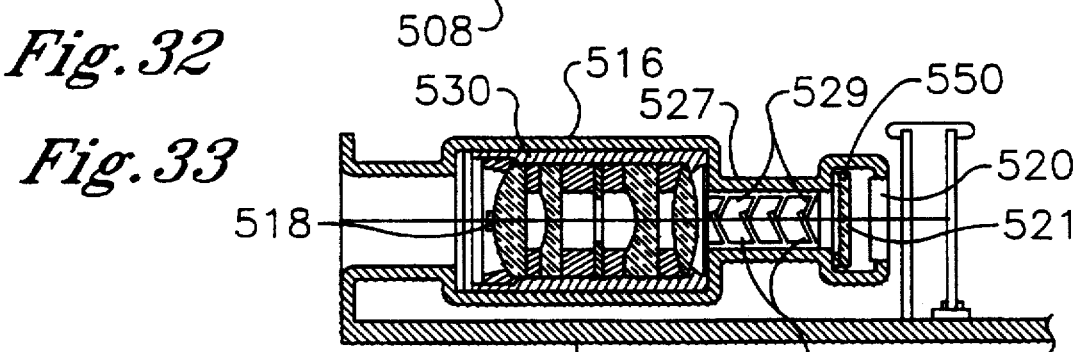
FIG. 33 is a cross-sectional view taken along line 33—33 of FIG. 32.

After the light produced by the LEDs is reflected from the target bar code it is collected by optic module 517 which comprises a number of focusing lenses mounted inside a lens support 530, all of which are retained within dark room 516. Baffle section 527 of dark room 516 extends to cover the space between the lens assembly 518 and the detector 520. The details of baffle section 527 are best shown in FIG. 33, where it can be seen that each baffle 529 runs horizontally with respect to the PCB 2, extending at an angle into the optical axis 532 and in the direction of the incoming reflected light. The use of the dark room baffle section 527 is analogous to a high power laser shingle calorimeter. The concept of the shingle calorimeter is to capture all of the energy that goes into the system. In the case of the baffles in the darkroom, all of the stray, scattered and reflected light from both the incoming signal and the reflections from the glass shield 521 over the detector 520 is captured. The baffle spacing and angle of slant towards the incoming beam allows for capture and subsequent absorption of scattered and stray light coming out of the signal beam. Analysis suggests that the absorption will be complete after three internal reflections off of the baffles 529. Light reflected back from the detector cover glass 521 will strike the baffles 529 at a 75° angle and send the light ray down into the second set of baffles. The angle of the baffles insures that reflected light will ultimately be absorbed in the baffle system and not re-reflected back to the detector 520.

Another feature which cuts down noise at the detector 520 is a light absorptive mask or frame 550 which frames the detector 520 to reduce reflections from the cover glass 521 of the detector. Mask 550 also reduces the possibility of light reflecting at an odd angle off of the baffles 529. Generally, the mask 550 becomes a primary field stop of immediate reflected light from the cover glass 521 and a secondary field stop for any stray light from the baffles 529.

Figure 27:
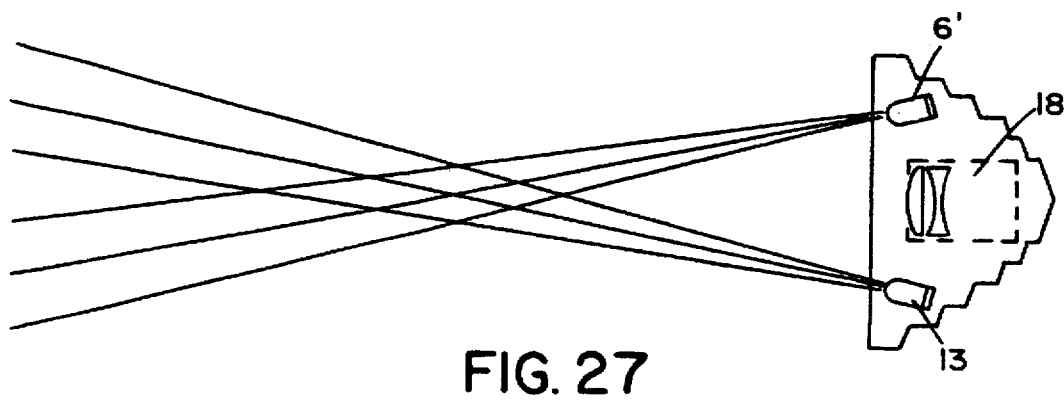
FIG. 27 is a diagrammatic view of the light distribution for the embodiment of FIG. 17.

As an alternative to the above LED distributions, FIG. 17 illustrates a configuration using only two LEDs 1702 and 1704, with one LED positioned on each of the opposite sides of the optical assembly 1717. As above, the LEDs are positioned to emit light at a non-zero angle with respect to a line running perpendicular to the front of the PCB 1722 or scanner housing opening. A single lens element 1724, 1725, such as the ones described above, for manipulation of the light from each LED, is also used. The dark room components 1708, 1709 and 1716, as well as detector 1720, are configured as in the embodiment of FIG. 5. The illumination pattern of this LED configuration is illustrated in FIG. 27.

The LEDs for one- and two-dimensional scanners are selected so that they emit light at the wavelength of approximately 660 nm, red light within the visible spectrum. Generally, LEDs which emit light within the wavelength range of 400 to 700 nm may be used. This wavelength range provides optimal contrast for bar code scanning applications in which dark and light bars must be distinguished. (For three-dimensional bar codes, two or more distinct wavelengths of light are selected, one of which may be 660 nm.) Infrared light also provides enhanced contrast, so that LEDs emitting light outside of the visible spectrum may be used. LEDs of differing colors may also be used. The optimum scanning wavelength is determined by measuring several color and black and white codes of various types using a photometer. In the preferred embodiment, the LEDs have a peak wavelength of 592 nm. The incoherent light produced by the LEDs may be replaced by coherent light from by laser diodes, helium-neon lasers or other coherent light sources as long as the appropriate mechanical means, such as a rotating reflective surface, are provided to spread or scan the spot to generate the light.

An alternate light source is a flash lamp 130, or any other intense light source, illustrated in FIG. 28. Flash lamps are available to emit light at a number of different wavelengths. The wavelength at which the selected flash lamp emits light will be determined by the color of the bar code(s) and the background, so that the best possible contrast is obtained. A parabolic reflector 132 is included within the optical scanning head assembly with the flash lamp 130 at its center. This allows the maximum amount of light to be directed forward for illumination of the bar code. The higher intensity light will permit scanning at distances greater than 35 inches.

A sample test for bar code contrast measurement involves placing the targets in uniform illumination (from a standard white light source) and measuring the photonic reflectance with the meter. In such a test, the following references were measured:

TABLE 1

| Target | Reflectance(cd/m²) |
|---|---|
| Standard white card | 330 |
| Standard black card | 14.0 |
| White bar | 300 |
| Black bar | 22.0 |
| Red bar | 97.0 |
| Blue bar | 114.0 |
| Green bar | 140.0 |

Another consideration in selection of LEDs is based upon the detectors to be used. The selection of the operational wavelength of an LED with a particular type of CCD is determined by two parameters: first, the spectral responsivity of the CCD in volts/lumen (V/L) or volts/watt (V/W) and, second, the total luminous flux output F in lumens (L) of the LED. The evaluation to determine the relative figure of merit between any combination of LEDs and CCDs is given by the following equation:

$$V_{out} = \int V(\lambda) F(\lambda) d(\lambda) \quad (1)$$

where $V(\lambda)$ is the CCD spectral sensitivity in volts/lumen/micron and $F(\lambda)$ is the flux output in lumens/micron of the LED. The normalized relative spectral sensitivity is given in FIG. 4-3 of the Sony data sheet for the ILX503. The flux output F is given by the maximum luminous intensity $I_v$ (lumens/steradian) times a constant determined by the radiation pattern of the LED. The constant is the integration of the relative luminous intensity as a function of angular displacement. This constant of integration is provided in the Hewlett-Packard data book (in FIGS. 7 and 8) and is labeled as $\phi_v(\theta)/I_v(O)$. The following LEDs were evaluated to determine the highest relative output voltage:

TABLE 2

| LED | $\lambda_{pk}$(nm) | $V(\lambda)$ | $I_v$ (l/sr) | $\phi_v(\theta)/I_v(O)$ | $V_{out}$* |
|---|---|---|---|---|---|
| HLMA-CL00 | 590 | 0.9 | 1.3 | 0.180 | .22 |
| HLMP-8104 | 650 | 0.7 | 4.0 | 0.115 | .32 |
| HLMP-8100 | 650 | 0.7 | 0.7 | 0.290 | .14 |
| HLMP-8150 | 650 | 0.7 | 15.0 | 0.016 | .17 |

(*Since the CCD is optically filtered, the expression for $V_{out}$ can be approximated by a delta function.) For purposes of this exemplary embodiment, the HLMP-8104 was found to be the most efficient, offering 1.5 times the output of the next lower LED at 650 nm.

(* Since the CCD is optically filtered, the expression for $V_{out}$ can be approximated by a delta function.) For purposes of this exemplary embodiment, the HLMP-8104 was found to be the most efficient, offering 1.5 times the output of the next lower LED at 650 nm.

Several radiometric measurements were made on the HP-8103 LED (5 mm diameter) to make observations on the coupling efficiency of this LED with several off-the-shelf lenses. The LED was biased to 20 mA and the following was recorded:

TABLE 3

| Distance (inches) | Lens | Reading in eV | |
|---|---|---|---|
| | | Center | Line |
| 1.0 | no lens | 10.0 | — |
| 16.0 | no lens | 8.0 | — |
| 7.0 | 1 cylindrical | 8.5 | 5.0 |
| 1.0 | 1 cylindrical | 10.0 | 6.5 |
| 6.0 | 1 collection/ cylindrical | 6.2 | 6.0 |

The cylindrical lens used is a Melles Griot 19.0 mm focal length and the collection lens is a plano-convex Germanon-Simon 15.3 mm focal length. The conversion from eV to luminance is given in Table 4 for the Minolta photometer. The units are candel/m² which is equivalent to lumens/sr-m². From these measurements, it would be reasonable to assume a luminance of 10.0 cd/m² for distances of 7" or less.

TABLE 4

| eV | cd/m² |
|---|---|
| 1 | 0.28 |
| 2 | 0.56 |
| 3 | 1.10 |
| 4 | 2.20 |
| 5 | 4.5 |
| 6 | 9.0 |
| 7 | 18.0 |
| 8 | 36.0 |
| 9 | 72.0 |
| 10 | 144.0 |

In a secondary exemplary embodiment, the LEDs were selected with the following criteria.

TABLE 5

| | |
|---|---|
| Peak output wavelength: | 592 nm |
| Input voltage: | 5V |
| Current draw: | 50 mA max. |
| Luminous efficacy: | 480 lumens/W |
| Peak intensity: | 6000 mcd |
| LED lens: | untinted and undiffused |
| Collection lens: | single element refractive/binary diffraction lens of fused silica, glass or photopolymer |
| Input source intensity distribution: | 7–8 degree lobe |
| Output illumination distribution: | 80% uniformity over a wide field of view; 90% uniformity over a narrow field of view |
| Area fill: | coverage over the wide field of view of the imaging lens |

The objective of the optical system design is to achieve sufficient resolution on the object distance within the depth of field. These parameters may be obtained with a number of different lens combinations ranging from three to five or more lenses. After computer simulation of ray traces, a combination of four lenses was selected to provide the desired performance. In first exemplary embodiment, the overall optical system specification calls for an object distance of 175 mm, a nominal magnification of 0.32, a nominal f/number of 26.0, effective focal length of 36.52 mm, total field of 26.5 degrees, track length of 19.49 mm and overall length of 46.89 mm. The MTF at best focus is >0.5 at 25 lines/mm.

The optic module 17 of the first exemplary embodiment of FIG. 1 consists of four lenses mounted inside a slidable lens support 21, all of which are retained within dark room 16. The selection of the four lenses of which the lens assembly 18 is formed depends upon the desired reference plane, i.e., the desired depth of field, defined as the distance between the front window or diffuser and the bar code being scanned. The lens assembly, illustrated in the ray trace in FIG. 3, consists of a bandpass filter 34, a bi-convex lens 32 and piano-concave lens 38, a biconcave lens 36 followed by a bi-convex lens 40. The lenses may be coated with an anti-reflection coating and/or a pass-band coating to minimize reflectance at the interfaces between the adjacent lenses and at the ends of the lens assembly, as is known in the art.

Figure 26:
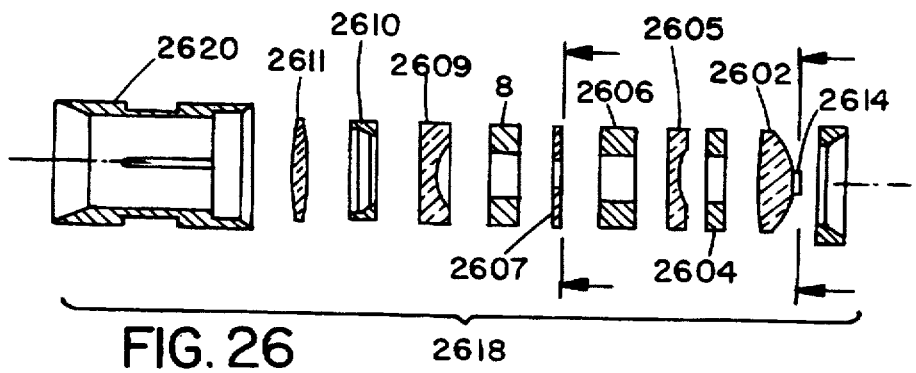
FIG. 26 is an exploded view of a second exemplary embodiment of the lens assembly.
Figure 39:
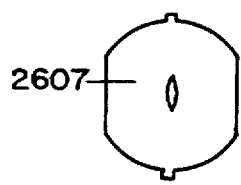
FIG. 39 is a diagrammatic view of a cat's eye aperture.
Figure 40:
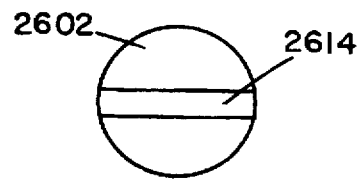
FIG. 40 is a diagrammatic view of a rectangular obscuration for use with the cat's eye aperture.

A second exemplary embodiment of the lens assembly 2618 is illustrated in FIG. 26 and consists of a bi-convex lens 2602 followed by a first spacer 2604, a biconcave lens 2605, a second spacer 2606, an aperture 2607, a third spacer 2608, a biconcave lens 2609, a fourth spacer 2610 and a bi-convex lens 2611, all of which fit into lens support 2600. Different lens combinations may be used with the object of focusing the incoming beam to provide the maximum useable light at the detector.

Table 6 lists the individual specifications that were identified for each lens in the first exemplary embodiment.

TABLE 6

| Lens | Focal Length | Total Track |
|---|---|---|
| 32 | 14.20mm | 3.63 ± .03 mm |
| 38 | −32.11mm | .60 ± .03 mm |
| 36 | −12.86mm | 1.66 ± .03 mm |
| 40 | 35.18mm | 1.41 ± .03 mm |

All lenses are made from BSC7 with a refractive index of 1.514 at 660 nm, have an aperture stop diameter of 1±1 mm with a tolerance of ±0.05 mm and have a single layer anti-reflective coating at 660 nm. The values will vary if different combinations of lenses and/or material are to be used, and the above specifications are provided as an example of one way of achieving the desired optical performance. Selection of appropriate lens combinations is within the level of skill in the art so long as the guidelines provided herein are followed. The following descriptions of the plots provided in the drawings are intended to emphasize the numerous considerations in selecting the appropriate optical system.

FIGS. 20 through 25 provide plots which assist in selection of appropriate lens combinations. FIG. 20a, a plot of field curvature/distortion, illustrates the position away from the plane of the CCD of best focus for all field angles expressed as distance in millimeters. For example, for a field angle of ±13° off-axis, the position of best focus is 2.00 mm behind the CCD array. For all other angles, the plane of best focus corresponds very closely to the CCD location.

Figure 20A:
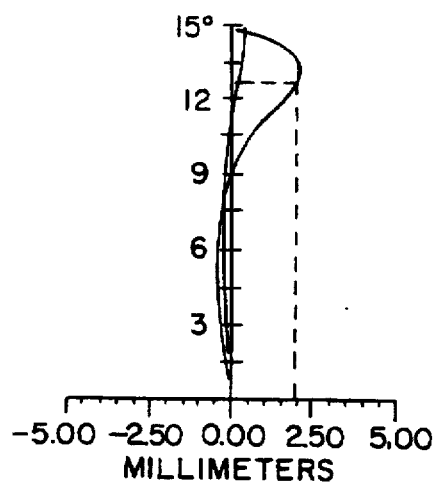
FIG. 20a is a plot of field curvature with field angle and FIG. 20b is a plot of percentage distortion with field angle.
Figure 20B:
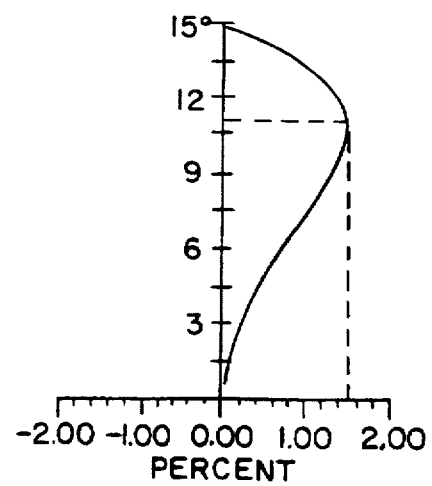

FIG. 20b plots percentage compression or expansion with field angle and provides the amount of compression or expansion of a bar width at the image plane in comparison with the true bar width expressed as a percentage. For example, if the true bar width on-axis is 6 mils wide, then at 11° off-axis, the bar width is 1.5% greater than 6 mil.

Figure 21:
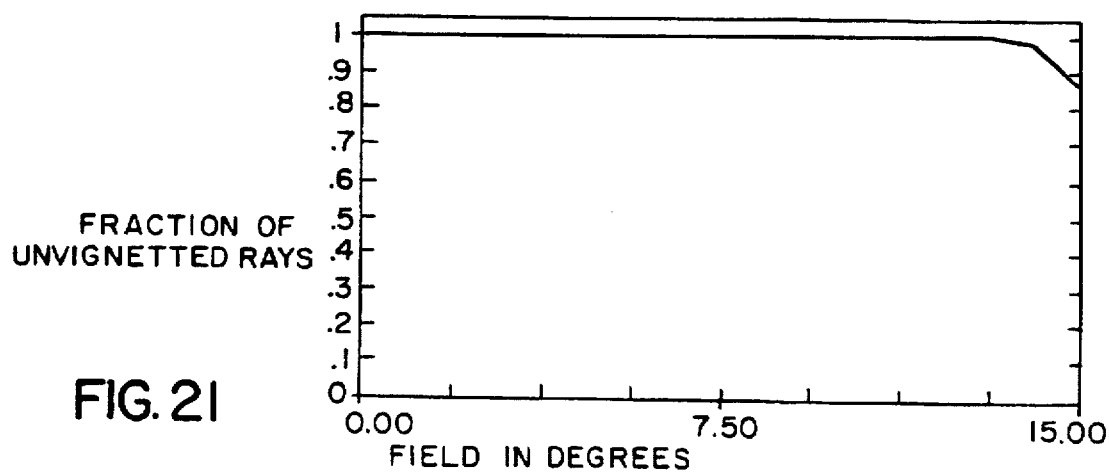
FIG. 21 is a plot of illumination uniformity as a function of field angle at the CCD.

Illumination uniformity as a function of field angle is charted in FIG. 21. The field angle values given in the plot are positive or negative angles with respect to "on-axis", so that the total field of view would be twice that value plotted, e.g., for 15°, the total field of view is 30°. The loss of illumination at increased field angle is due to aperture blockage or lens constraints.

Figure 22:
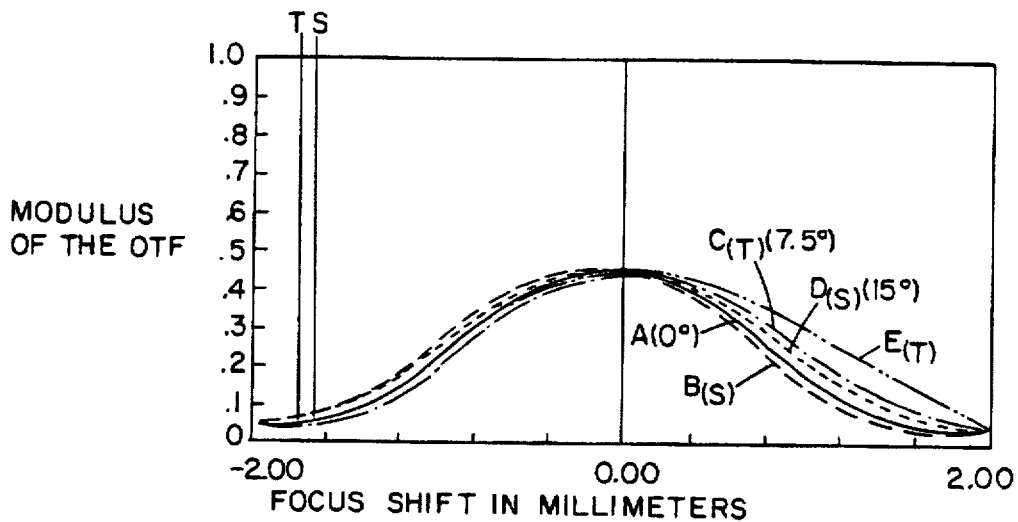
FIG. 22 is a plot showing contrast reduction with depth of focus for various field angles.

FIG. 22 is a plot of the diffraction through focus modulation transfer function (MTF). Five separate lines are drawn to indicate variation with field angle. Curve A shows the contrast reduction as the object is held at best focus while the image plane is moved in and out of focus for a field angle of 0°. (The x-axis of the plot is focus shift in millimeters.) For example, for a 30 line/mm resolution bar target, the contrast goes to zero when the image plane is moved in or out by more than 2.00 mm. Curves B and C are for a field angle of ±7.5° off-axis. Curve B is for sagittal rays and curve C is for tangential rays. Tangential rays only are images for the one-dimensional scanner, while two-dimensional scanner images use tangential and sagittal rays. Curves D, and E are similar to curves B and C, respectively, but are for a field angle of ±15° off-axis.

Figure 23:
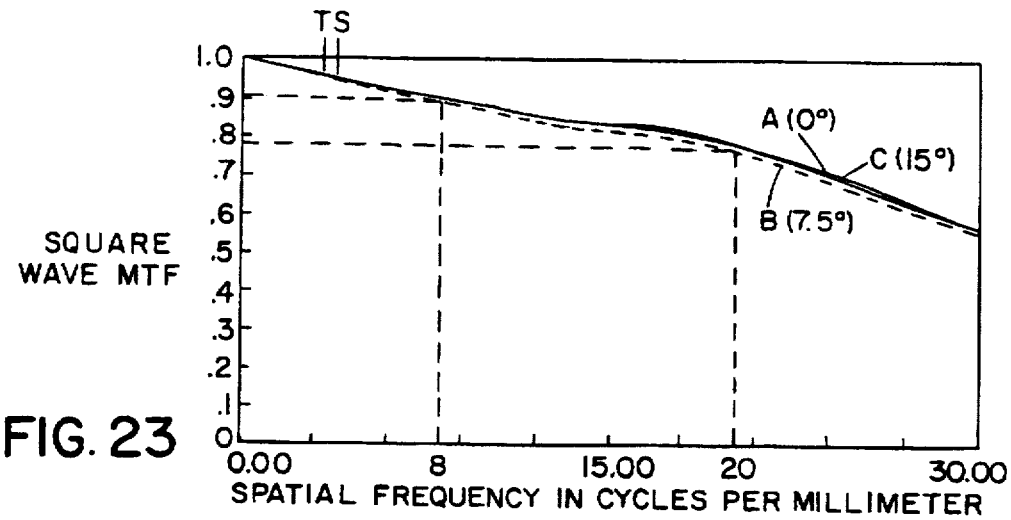
FIG. 23 is a plot showing contrast for all spatial frequencies at a distance of 5.5" from the scanning head.

FIG. 23 is a plot of diffraction square wave MTF with spatial frequency of the symbols (bar codes, etc.) to be read. Curve A provides the contrast of the optical system for all spatial frequencies at a distance of 5.5" for objects on-axis (0°). The plot is the same for tangential and sagittal rays for the on-axis case only for rotationally symmetric systems. Curve B is for a field angle of ±7.5° and curve C is for a field angle of ±15°.

Figure 24:
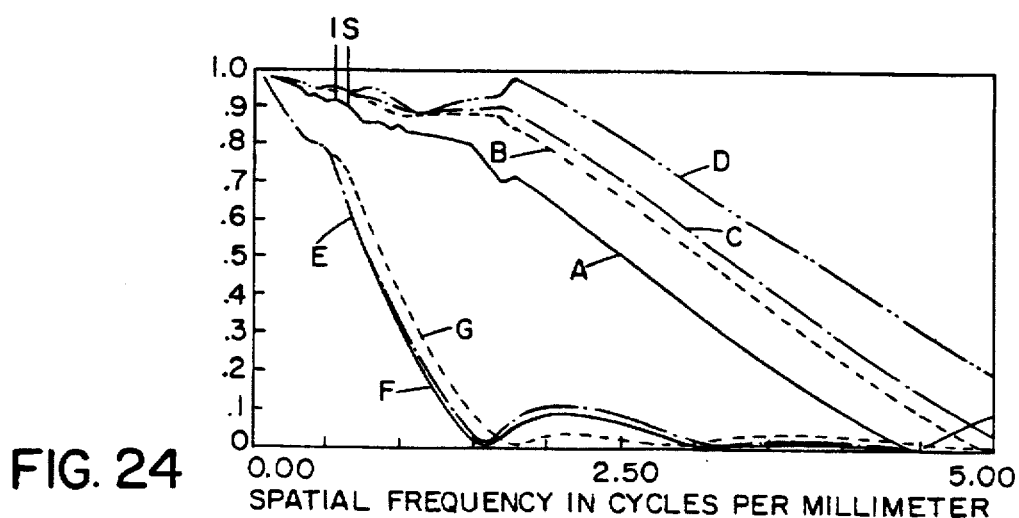
FIG. 24 is a plot showing resolution at various field angles at a given distance from the scanning head.

FIG. 24 is a plot of diffraction square wave MTF with spatial frequency of the symbol. Curve A is resolution with the scanner 20" from the symbol, on-axis (0°). Curves B,C and D are for on-axis, ±7.5° and ±15°, respectively at a distance of 16 inches from the code. Curves E, F and G are for on-axis (0°), ±7.5° and ±15°, respectively at a distance of 0.5" from the code which is being scanned.

Figure 3:
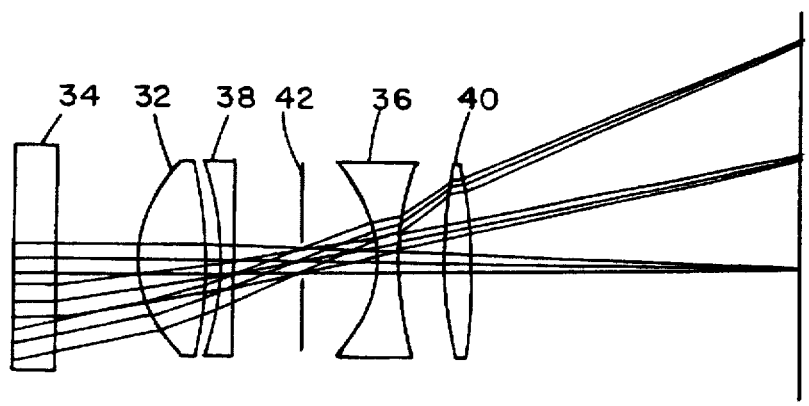
FIG. 3 is an exploded view of a first exemplary embodiment of the lens assembly.
Figure 13A:
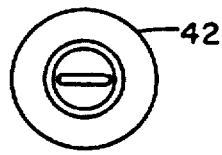
FIGS. 13a and 13b are front views of air slits/apertures for one-dimensional and two-dimensional applications, respectively, in a first exemplary embodiment.
Figure 13B:
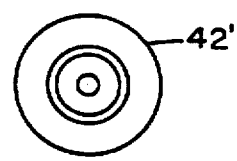

FIG. 25 is a plot of resolution on-axis at 8.5" and 2" from the symbol, respectively A spatial filter or aperture may be included within the optical module, disposed adjacent to, or even integral with, the lens assembly, as illustrated in FIGS. 3 and 26. In a first exemplary embodiment of FIG. 3, the spatial filter 42 is an air slit with an orientation and configuration corresponding to the shape of the bar code being scanned, or can be a circular aperture 42' as illustrated in FIG. 13b. For a one-dimensional bar code, a single slit, illustrated in FIG. 13a, is used. The slit is oriented vertically so that it is perpendicular to the direction in which the bar code is scanned. Alternatively, for a one-, two- or three-dimensional (multi-color, superimposed code) scanner, a single circular aperture 42' may be used. The bandpass filter 34 serves to block any radiation which falls outside of a wavelength range centered around 660 nm (or wavelengths surrounding infrared light for the infrared scanner). For the visible light system, it is particularly desirable to filter the infrared and other visible portions of the light spectrum which may reach the window from the sensing region to provide optimal contrast. This improves resolution of bar codes read at a distances other than the best focus object distance of 5.5 inches. In the first exemplary embodiment, the filter specifications call for a center wavelength of 655 nm ±6 nm, half bandwidth points (HBWP) of 50 nm ±5 nm, average transmittance (HBWP) greater than 70%, leakage of less than 2% below 600 nm and above 700 nm, and coverage to 1 mm from all edges. The substrate material can include BK7, fused silica, quartz or Corning 7059.

Figure 41:
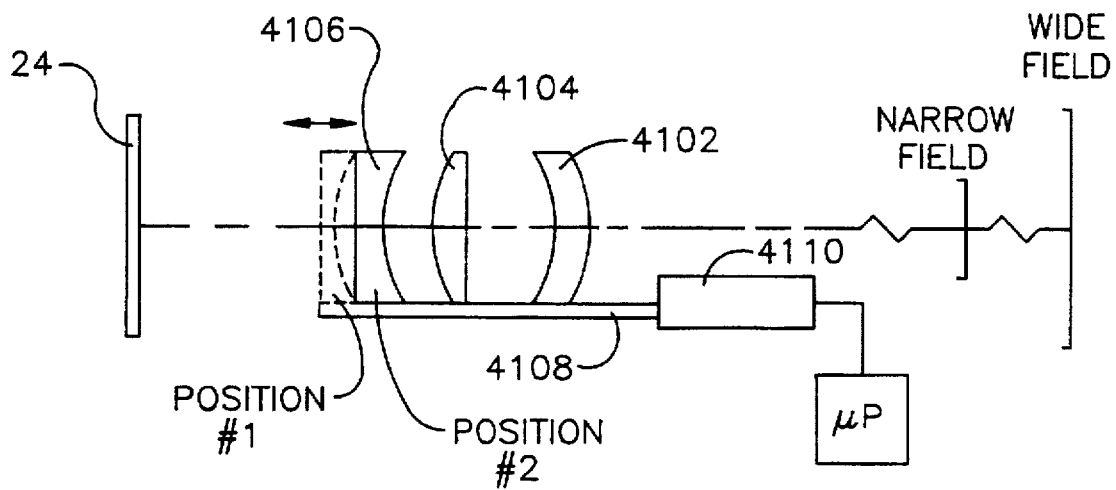
FIG. 41 is a diagrammatic view of the imaging optics for the dual focus embodiment.

In an embodiment which provides enhanced capability to read a wide range of depths of field, variable imaging optics are provided, as illustrated in FIG. 41. The imaging optics automatically change their effective focal length and f number and, hence, the magnification, to capture, with sufficient resolution, symbologies having a variety of feature sizes that are frequently found in bar codes. The imaging optics may have several distinct, pre-determined positions. In the exemplary embodiment, two distinct depths of field, i.e., a short depth for focus of symbologies of small extent and high spatial density, and a long depth of focus for symbologies of large extent and low spatial density but distinctly different and single images, are used. This is distinguishable from the extended focus optical scanner disclosed in U.S. Pat. No. 5,210,398 of Metlitsky, which simultaneously collects the image at two distinct focal lengths. A dual field of view lens changes the effective focal length of the imaging optics from 7 mm to 21 mm and covers a semi-angular field of 10 to 30 degrees, varying the magnification with the changed focal length. Other designs can be derived having the same 3:1 ratio of focal length and field of view. Magnification at zoom position #1 is on the order of 1/5x and the focal length is 21 mm. At zoom position #2, magnification is 1/15x and the focal length is 7 mm. The field of view at zoom position #1 is 10° and 30° at position #2.

The optical design of the imaging optics, illustrated in FIG. 41, comprises the simplest possible zoom lens having three or four elements, and is a design of a reversed telephoto-type with a negative front singlet. Here, three elements are shown, consisting of a negative meniscus lens 4102, plano-convex lens 4104 and plano-concave lens 4106. Zoom capability is provided by movement of lens 4106 away from or toward lens 4104. This design is well corrected for apertures varying from f/8 to f/16. In a first exemplary embodiment, the aperture optically adjusts from f/11 to f/16. The lenses have optical aberrations corrected over the depth of field for both fields of view with respect to the minimum feature size anticipated. The zoom lens obeys the optical invariant as follows:

$$f_{min} \tan (\omega_{max}) = f_{max} \tan (\omega_{min}), \tag{2}$$

where f is the focal length, and

ω is the half angle field of view.

The zoom lens further obeys the relationship that as the angular field of view coverage increases, the entrance pupil increases. It can either have a circular or square aperture. A circular aperture can be used for hexagonal symbologies, such as UPS bar codes, while the square aperture can be used for PDF bar codes.

The lenses of the imaging optics may have an anti-reflection coating such as BBAR coating to reduce reflectance of light of the desired bandwidth from the lens surfaces and interfaces. An optional sunlight filter can be provided to eliminate noise from ambient light. Exemplary filters include Corning™ photochromic filter glass and a 20 nm bandpass filter centered at 590 nm.

Automatic variation of the focal length of the imaging optics is accomplished by attaching the zoom lens, specifically, lens 4106, to a shaft or track 4108 which is centered within the optical path so that no change occurs in the axial position of the focal plane. The drive means 4110 for the zoom function is provided by the same type of mechanism as would be included in a commonly available motorized zoom lenses for cameras, e.g., a small, light-weight DC servo motor or simple solenoid with a spring mechanism. Such mechanisms are well known in the art. Activation of the DC motor or solenoid (with dimensions on the order of 8 mm×10 mm×20 mm) is controlled by the microprocessor that controls the scanner. In a first exemplary embodiment, the zoom mechanism is a 3V DC motor with minimum 7.0 g-cm stall torque, or an equivalent solenoid, such as a magnetically latching or permanent magnet solenoid. Essentially, the control signal consists of a timing signal which periodically causes the zoom lens to move to one of two pre-set positions corresponding to the two fields of view at pre-determined intervals which may be set within the microprocessor. A triggering event for activating the change command can be failure to obtain a "good read". At a pre-determined time after attempting but failing to obtain a good read, the location of lens 4106 is changed to the other zoom position.

Alternatively, the focal length can be manually selected by the user by providing an input mechanism to the microprocessor to designate the desired position of the two options and to discontinue the automatic timed movement of the zoom lens.

In a second exemplary embodiment of the zoom lens, including the adjustment mechanism, the following parameters were selected:

TABLE 6

| | |
|---|---|
| Wavelength of operation: | 450–650 nm |
| Aperture: | Optically adjusting—f/11–f/16 |
| Zoom function: | Optically compensated—movement of front negative element |
| Zoom mechanism: | 5V DC Magnetic latching solenoid, 7 W total power, 1 sec. charge time and 50 msec discharge, reversible voltage |
| Solenoid size: | 0.44" dia. × 0.75" (including shaft) with 5 mm stroke |
| Solenoid weight: | 18 gm |
| Magnification: | 3:1—Zoom position 1: 1/5.5×; Zoom position 2: 1/15× |
| No. of elements: | 3 or 4 with asphere |
| Lens element diameters: | 10 mm |
| Lens element coatings: | BBAR coating; <1% reflectance from 450 nm to 650 nm |
| Focal length: | Zoom position 1: 21 mm; Zoom position 2: 7 mm |
| Horizontal field of view: | Zoom position 1: 10°; Zoom position 2: 30° |
| Nominal object distance (from window): | 4.5" |
| 100% ensquared energy: | <40 microns |
| Allowable vignetting: | <10% |
| Allowable distortion: | <10% |
| Overall barrel length: | 25 mm |
| Barrel diameter: | 12 mm |
| Optical lens assembly weight: | 28 gm |
| Overall length (lens to CCD): | 60 mm |
| Inaccessible distance (from lens to scanner window): | 1.0" |
| Total length from CCD to window: | 2.5" |
| Standard filter: | CM500 or equivalent |
| Optional sunlight filter: | Corning photochromic filter glass or custom 20 nm bandpass filter with center at 590 nm |
| Apodizer filter: | Fresnel Phase Zone Plate made of polymethylmethacrylate (PMMA) |

The dual focus optical system provides the following depth of field performance:

TABLE 7

| | Depth of Field "DOF" | |
|---|---|---|
| Feature Sizes "s" | Position 1 = 1/15× | Position 2 = 1/5× |
| 6 mil | 1.25" | 3.00" |
| 10 mil | 3.25" | 4.25" |
| 15 mil | 4.25" | 5.25" |
| 20 mil | 5.00" | 6.00" |
| 30 mil | 7.00" | 7.00" |
| 40 mil | 9.75" | 9.75" |
| 55 mil | 12.00" | 12.00" |

A spatial filter, or apodizer, may be included to further enhance the depth of field of the scanner. The apodizer serves to decrease the irradiance of the outer parts of the Point Spread Function (PSF) without increasing the size of the pupil aperture, thus providing considerably higher overall transmission than annular apertures of the prior art. The apodization has the effect of enlarging the central part of the irradiance PSF. This PSF is the Strehl ratio of the optical system and can be evaluated with optical design software. If the irradiance PSF is thought of as the Strehl ratio versus defocusing, apodization will increase the depth of focus. However, when imaging an extended object, the Strehl ratio may not be sufficient for assessing the optical system. For this reason, the modulation transfer function (MTF) of the apodizers is evaluated. The MTF of the apodizers is obtained by numerically taking the inverse Fourier transform of the irradiance PSF. The PSF of a two-dimensional optical system with radial symmetry that has focusing errors is described by Equation 3:

$$PSF(r,W) = 2\pi \int_0^\infty (P(\rho) \exp(i2\pi W(\rho/\omega)^3) J_0(2\pi r\rho) \rho \, d\rho) \quad (3)$$

where r is the radius of the aperture, W is the aberration as a function of defocus, P is the pupil function, ρ is the pupil radius, ω is the radius of the collection optics, and $J_0$ is the zero order Bessel function.

According to the teachings of W. T. Welford in "Use of Annular Apertures to Increase Focal Depth", J. Opt. Soc. Am. 50, p.749 (1960), the irradiance distribution along the optical axis $((q(W))^2)$ where r=0 and with no defocusing can be expressed as:

$$(q(W))^2 = (PSF(r=0,W))^2 \quad (4)$$

or $$(q(W))^2 = [\pi\omega^2 \int_0^\infty (P(\rho) \exp (i2\pi W(\rho/\omega)^3) d[(\rho/\omega)^2]]^2. \quad (5)$$

Following the above expressions, it becomes necessary to analyze the imaging properties of the apodizers which, under a suitable geometrical transformation, are the Fourier transform of Bessel functions given in Equation 3.

The desired spatial filter or apodizer uses the above approach to maximize the depth of field, i.e., determine the minima for q(W). Imaging properties can be evaluated using software to calculate MTF from the PSF of the new apodizers.

In a second embodiment of the apodizer, a cat's eye aperture shapes the central lobe of the Airy disk (the diffraction pattern) to minimize the incoming information, reducing the value of the numerical aperture. The rectangular obscuration increases the angular separation of the lines of the bar code. (The cat's eye is parallel to the individual lines of the bar code, i.e., the axis of the bar code.

Working in cooperation with cat's eye aperture 2607 is a horizontal blocking mask 2614 which is patterned onto the entrance aperture of bi-convex lens 2602, as illustrated in FIG. 5. Blocking mask 2614 is thin film coated directly onto the lens using techniques that are known in the art. Alternatively, blocking mask 2614 can be placed on an optically transparent film, then placed immediately adjacent to lens 2602. The blocking mask 2614 allows the use of longer spatial frequencies so that the modulation transfer value (MTV) increases substantially at modulation transfer function (MTF)=0.5. The cat's eye aperture 2607 provides for an increase in the light for the first bright ring of 2.76, the second bright ring of 4.15 and the third bright ring or Airy disk of 5.19. That is, the separation goes from 0.82λ/N.A. to 0.72λ/N.A. for the first bright ring and 1.33λ/N.A. to 1.23λ/N.A. for the second bright ring. Third and fourth bright rings follow commensurately. The central obscuration prohibits the integration of the central Airy disk. Thus, the light transmission to the detector is not constant across the aperture, of the lens assembly with the transmission at the center being reduced and the relative amount of light in the surrounding rings being increased.

The analytical model for the cat's eye technique is derived from several components. First is the modification of the MTF of a basically clear aperture system to that of a Cassegrainian system, i.e., where there is central obscuration in the pupil function for the incoming signal. The technique for the cat's eye, however, requires a rectangular obscuration since the bar code is essentially rectangular. The rectangular obscuration must be set normal to the axis of the bar code target. The elliptical aperture at the focus of the lens assembly 2618, leading to the image plane, will be set in the same plane as the bar code and normal to the rectangular obscuration on the collection optic, lens 2602. The point image intensity distribution t(x,y) will follow from the transfer function:

$$\tau(\mu, \nu) = \int_{-\infty}^{\infty}\int (t(x, y) e^{j(\mu x+\nu y)}dxdy) \quad (6)$$

where t(x,y)=s(x,y)s*(x,y), where s(x,y) is the amplitude distribution.

Equation (6) can now be written as:

$$\tau(\mu, \nu) = \int_{-\infty}^{\infty}\int S(\mu_0, \nu_0)S^*(\mu_0 - \mu, \nu_0 - \nu)d\mu_0 d\nu_0. \quad (7)$$

The transfer function for a diffraction limited system can be evaluated either by a direct Fourier transform of the spread function (Eq. (6)), or by means of a convolution integral of the aperture function with its complex conjugate (Eq. (7)). The second equation offers the advantage of being able to evaluate the wave front characteristics without the complicated detail of the physical diffraction pattern. Nonetheless, the point energy image distribution will be evaluated as a second component of the cat's eye technique.

The following equations are used for evaluating the MTF as a function of frequency:

$$\tau(\omega) = \{\sqrt{\omega_0(1-\eta^2)}\}\{I_1 + \eta^4 I_2 - 8\eta I_3\} \quad (8)$$

where:

$$I_1 = \int_0^\infty \int_0^{2\pi} [2J_1 R]^2 e^{i\Omega R\cos\theta}(R)^{-1}d(R)d\theta \quad (9)$$

$$I_2 = \int_0^\infty \int_0^{2\pi} [2J_1(\eta R)]^2 e^{i\Omega/\eta(\eta R)\cos\theta}(\eta R)^{-1}d(\eta R)d\theta \quad (10)$$

$$I_3 = \int_0^\infty \int_0^{2\pi} J_1(R)J_1(\eta R)e^{i\Omega R\cos\theta}(R)^{-1}d(R)d\theta, \quad (11)$$

where $J_1$=Bessel function of the first order R=ωr. Inserting the proper values, MTF can be evaluated so that $$\tau(\omega) = \frac{1.0}{1-\eta^2}[A + B + C], \quad (12)$$

where: for $0 < \frac{\Omega}{2} < 1.0$, $$A = \frac{2}{\pi}\{\cos^{-1}\Omega/2 - \{\Omega/2\sqrt{1.0-(\Omega/2)^2}\}\};$$

for $\frac{\Omega}{2} > 1.0$ $A = 0$;

for $0 < \frac{\Omega}{2\eta} < 1.0$, $$B = \frac{2\eta}{\pi}\{\cos^{-1}(\Omega/2\eta) - \{\Omega/2\eta\sqrt{1.0-(\Omega/2\eta)^2}\}\}$$

for $\frac{\Omega}{2\eta} > 1.0$, $B = 0$;

-continued for $0 < \frac{\Omega}{2} < \frac{1.0-\eta}{2}$, $C = -2\eta^2$ for $\frac{1.0-\eta}{2} < \frac{\Omega}{2} < \frac{1.0+\eta}{2}$, $$C = \frac{2\eta}{\pi}\sin\phi +$$

$$\frac{(1.0+\eta)}{\pi}\phi - \frac{(2(1.0+\eta^2))}{\pi}\tan^{-1}\left\{\frac{[1.0+\eta]}{1.0-\eta}\tan\phi/2\right\}$$

for $\frac{\Omega}{2} > \frac{1.0+\eta}{2}$, $C = 0$;

$$\phi = \cos^{-1}\frac{1.0+\eta^2-\Omega^2}{2\eta};$$

$\Omega = \frac{f}{f_0}$, where $f_0$ = cutoff frequency;

$\eta = \frac{D_i}{D_0}$, where $D_i$ = obscuring diameter and $D_O$ = aperture diameter In a prototype scanner utilizing the apodization technique of the second embodiment, the collecting lens is 12 mm. The obscuration, blocking mask 2614, measures 2.286 mm×10.88 mm. The resulting effective diameter is:

$$D_e = \frac{4 \cdot 2.286 \cdot 10.88}{2 \cdot 2.286 + 2 \cdot 10.88} \text{ mm} \quad (13)$$

$D_e = 3.7782$ mm and the value for η will be:

$$\eta = \frac{3.7782}{12} = 0.31485$$

Using the above equations, MTF can be plotted for the design obscuration. The plot of MTF with lines per millimeter is provided as FIG. 44, with comparative curves provided for no obscuration, curve A, 0.2 obscuration, curve B and obscuration for the calculated value of η,0.31485, in curve C. (The optical train NA is 0.1645)

Figure 44:
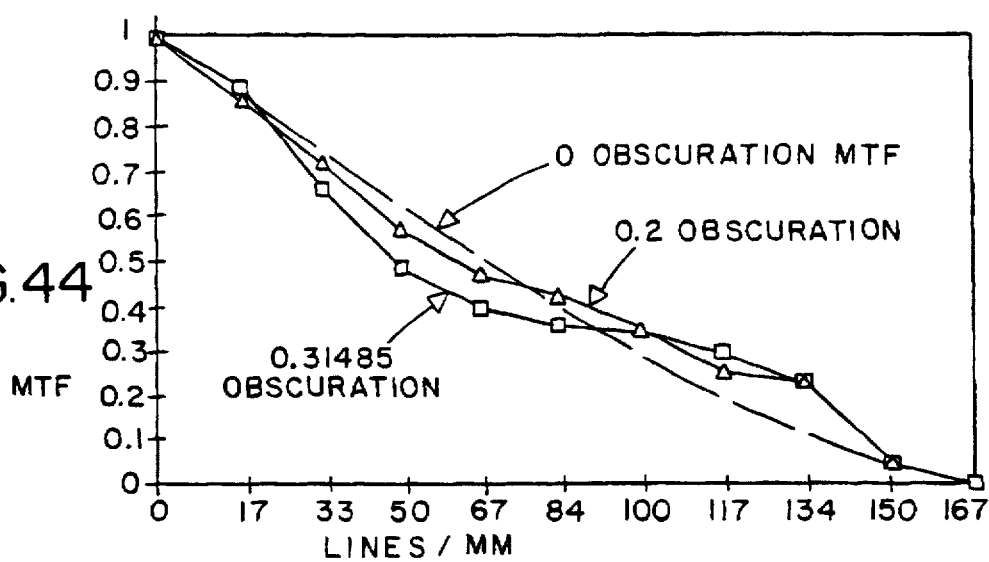
FIG. 44 is a plot of modulation transfer function versus resolution in lines per millimeter for the obscuration of FIG. 40.

It can be seen from the FIG. 44 that the obscuration gives substantially higher values at higher frequencies and somewhat lower values at the lower frequencies. This is expected from the equations. Thus, the central obscuration changes the MTF of the optical train rather dramatically and also changes the pupil function in a substantial fashion.

Now looking at the image intensity distribution as it approaches the cat's eye aperture 2607, it can be seen that the aperture will provide the contrast ratios that are needed to evaluate the lines and spaces of the bar code. The point intensity will follow from Equation 14.

$$s(r) = 2\pi \int_{\eta\omega_0}^{\omega_0} [J_0(\omega R)]\omega d\omega, \quad (14)$$

where $J_0$=Bessel function of zero order, which provides the point image intensity distribution:

$$t(R) = \frac{1}{1-\eta^2}\left\{\left[\frac{2J_1(R)}{R}\right]^2 + \quad (15)\right.$$

-continued $$\eta^4 \left[ \frac{2J_1(\eta R)}{\eta R} \right]^2 - \frac{8\eta J_1(\eta R)J_1(R)}{R^2} \Bigg\},$$

where:

$R=\omega_0 r$;

$\omega_0$=outer radius of collection optics; and r=radius in aperture.

For the prototype system using the cat's eye aperture, the cat's eye 2607 has a short axis of 1.0 mm and long axis of 1.875 mm. The relative intensity distribution in the image produced at the detector is plotted in FIG. 45, going from the center of the aperture along the long axis towards its end. This is essentially an evaluation of the amount of energy in the areas that are bounded by the resultant of the two dimensions of the aperture.

Figure 45:
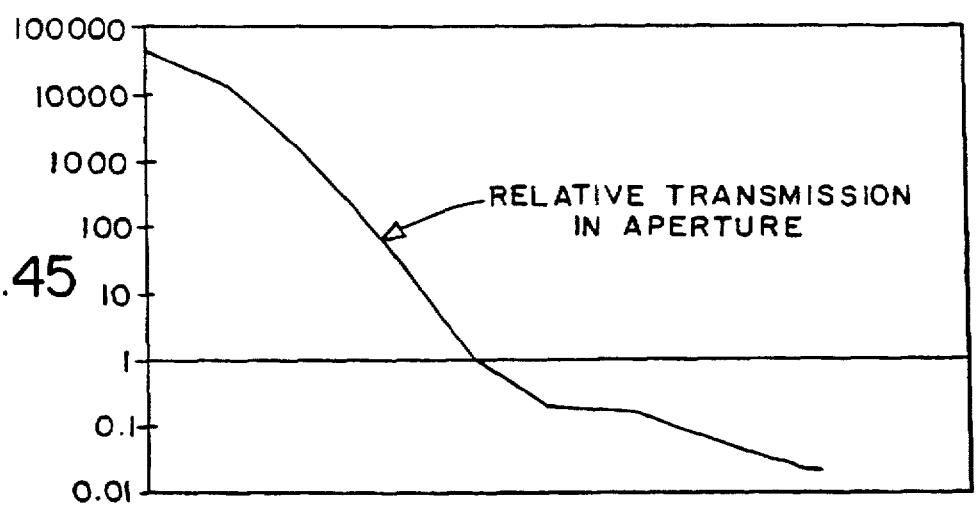
FIG. 45 is a plot of log relative transmission versus aperture height in millimeters for the cat's eye aperture of FIG. 39.

As seen in FIG. 45, the aspect ratio is large because of the area that is swept out in the progression from the value at 0 to the value at 0.99 mm. Because the change is logarithmic, the contrast between dark and light lines can be controlled as the pupil passes energy from the outer rings of the Airy disk after the center of the Airy disk has been blocked by rectangular mask 2614. This obscuration results in little information in the center and does not permit integration of the bar code lines in the center of the detector.

Figure 46:
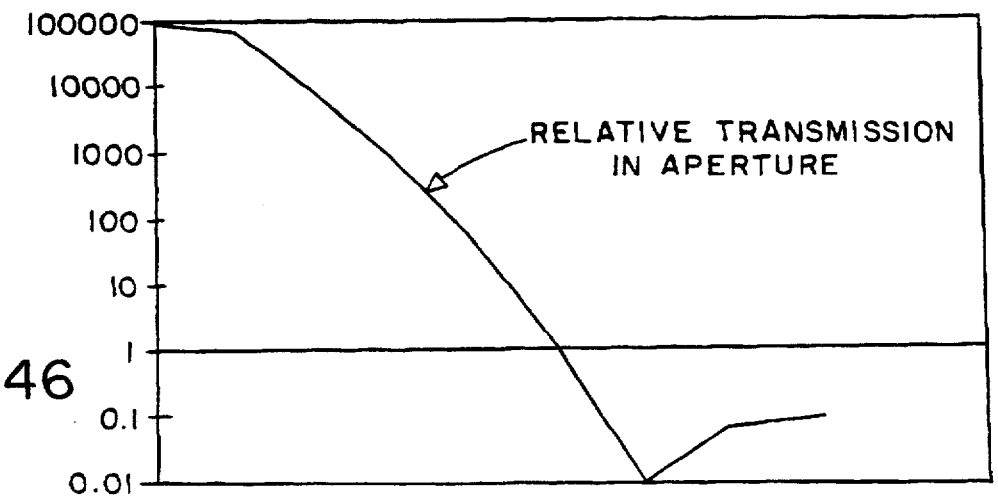
FIG. 46 is a plot of log relative transmission versus aperture width in millimeters for the cat's eye aperture of FIG. 39.

FIG. 46 is a plot of the transmission through the aperture progressing along the short axis from center to edge, again for light which has already been partially obscured by rectangular mask 2614.

It can be seen from the relationship between the obscuration and the cat's eye aperture that they can be closely coordinated. The aperture must have sufficient area to allow the signal strength necessary to read the contrast between the bar codes. The obscuration must be of sufficient dimension to apodize the pupil function and allow for the depth of field in the optical train. However, the mask is not necessary with the cat's eye aperture and the cat's eye can be sufficient to achieve the depth of focus. Also, a similar pupil shaping aperture can be placed elsewhere in the lens system. In the preferred embodiment it is at the aperture stop.

In a third embodiment of the apodizer, a Fresnel phase zone plate is used to increase the depth of field of the scanner without changing the focal length of the zoom lens. As with the previous embodiments of the apodizer, the Fresnel zone plate (FZP) is included within the optical assembly to provide a defocusing function. The defocus pupil function is given by:

$$P(u,v,z)=P(u,v,)e^{j4\pi z(u^2+v^2)} \tag{16}$$

where u and v are units of cut-off frequency, $$\frac{w}{z} = \frac{N.A.}{\lambda} \quad N.A. = \text{numerical aperture} = a/f \tag{17}$$

$a$ = pupil radius $f$ = focal length $z$ = units of depth of field $$\delta = \frac{\lambda}{(N.A.)^2} = \frac{4}{\lambda w^2}$$

The OTF is the autocorrelation of the pupil along a diameter, i.e., v=0.

$$H(u,0,z)=\int P(u'-(u/2),v',z)P^*(u'+(u/2),v',z)du'dv' \tag{18}$$

$$=\int \phi(u',u)e^{-j8\pi z u u'}du' \tag{19}$$

where $\phi(u',u)=\int P(u'-(u/2),v',0)P^*(u'+(u/2),v',0)dv'$. (20)

If the pupil is a Fresnel zone plate with N zones, each with unit side $|u|<\frac{1}{2}$, $|v|<\frac{1}{2}$, then:

$$P(u,v,z) = \sum_{n=-\infty}^{\infty} A_n e^{j4\pi nN(u^2+v^2)} \text{rect}(u)\text{rect}(v). \tag{21}$$

Equation 21 is an infinite FZP which is periodic in $\rho^2=u^2+v^2$;

$R_1$ is the outer radius of zone 1;

the period is $\frac{1}{2}N$.

Figure 42:
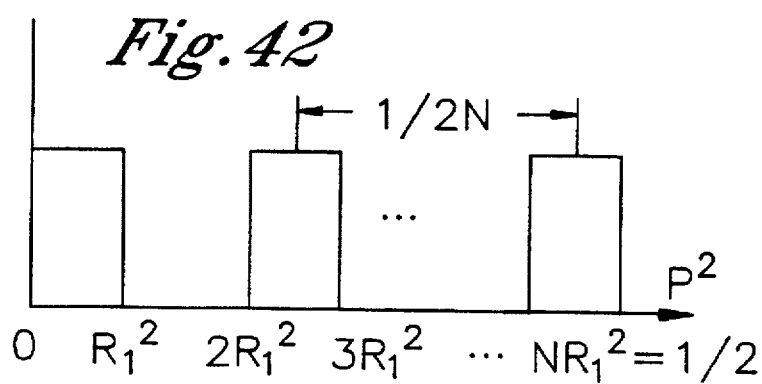
FIG. 42 is a plot of FZP zone radius versus period.
Figure 18H:
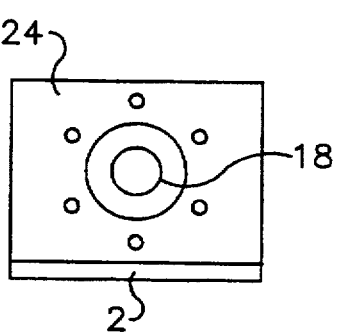

In terms of $\rho^2$, the period is $$2R_1^2+1/(2N), \tag{22}$$

as shown in the chart of FIG. 42.

Rewriting, $$\phi(u,u') = \int \sum_{n=-\infty}^{\infty} A_n e^{j4\pi Nn(u'^2+v^2+(u^2/4)-uu')}. \tag{23}$$

$\sum A_n$(complex conj.) · $\text{rect}(v')\text{rect}(u'/(1-u))dv')$, assuming u>0 or using 1–|u|.

If N number of zones is large enough, the following approximation can be made:

$$\int_{-1/2}^{1/2} e^{j4\pi Nn(n-m)v'^2}dv' \approx \delta(n-m) \tag{24}$$

The peak of the integral equation is at n=m, so that $$\phi(u,u')=\Sigma|A_n|^2 e^{-j8\pi nNuu'}\text{rect}(u'/(1-u)). \tag{25}$$

The OTF along v=0 becomes:

$$H(u, o, z) = \Sigma|A_n|^2 \int e^{-j8\pi(z+Nn)uu'}\text{rect}(u'/(1-u))du' \tag{26}$$

$$=\Sigma|A_n|^2 \int \frac{\sin[4\pi zu(1-u)]}{4\pi zu} \delta(z-Nn)dz. \tag{27}$$

In terms of the convolution integral, $$H(u, O, z) = \Sigma|A_n|^2 \delta(z+nN) * \frac{\sin[4\pi zu(1-u)]}{4\pi zu}. \tag{28}$$

For the first three terms, $$H(u, O, z) = A_0^2 \frac{\sin[4\pi zu(1-u)]}{4\pi zu} + A_1^2 \frac{\sin[4\pi z u(1-u)]}{4\pi(z+n)u} + A_{-1}^2 \frac{\sin[4\pi zu(1-u)]}{4\pi(z-n)u}. \tag{29}$$

Figure 43A:
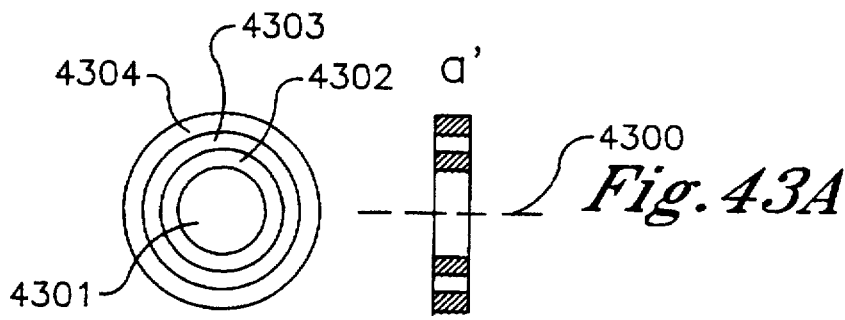
FIGS. 43a–c are variations of Fresnel zone plates (FZPs), with FIG. 43a showing a conventional FZP, FIG. 43b showing an improved FZP and FIG. 43c showing a Fresnel phase zone plate.
Figure 43B:
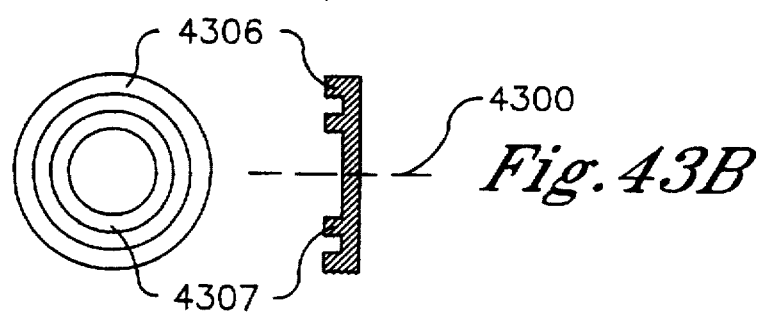
Figure 43C:
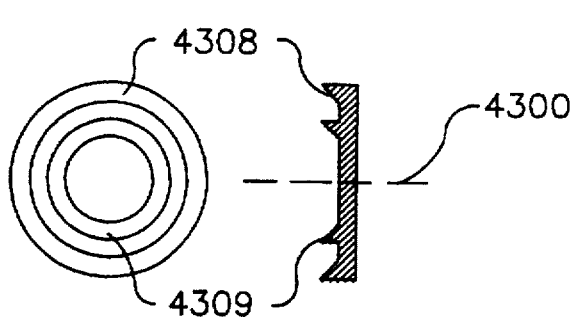

FIG. 43a–c provides a comparison between conventional FZPs, such as are disclosed in "Imaging with Fresnel Zone Pupil Masks: Extended Depth of Field", *Applied Optics*, 23, (1984), p.4299–4302, and illustrated as FIG. 43a and a', a first improvement comprising the Fresnel phase zone plate (FIG. 43b and b'), and a further improvement (FIG. 43c and c'). In the conventional FZP of FIG. 43a and a'(43a' shows the cross-section of the FZP), there are four zones, 4301–4304, with zones 4301 and 4303 acting to block portions of the light passing through the FZP. The optical axis 4300 runs through the center of each FZP. In the FZP of FIG. 43b and b', which is a first Fresnel phase zone plate (FPZP), the steps 4306 and 4307 have a thickness and refractive index to introduce a 180° phase change in the light passing through the steps, so as to result in constructive interference, intensifying the total light passing through the FZP. In the FZP of FIG. 43c and c', the steps 4308 and 4309 are higher order aspheres which modify phase depending on the radial point of entry of the light into the FZP.

Figure 47:
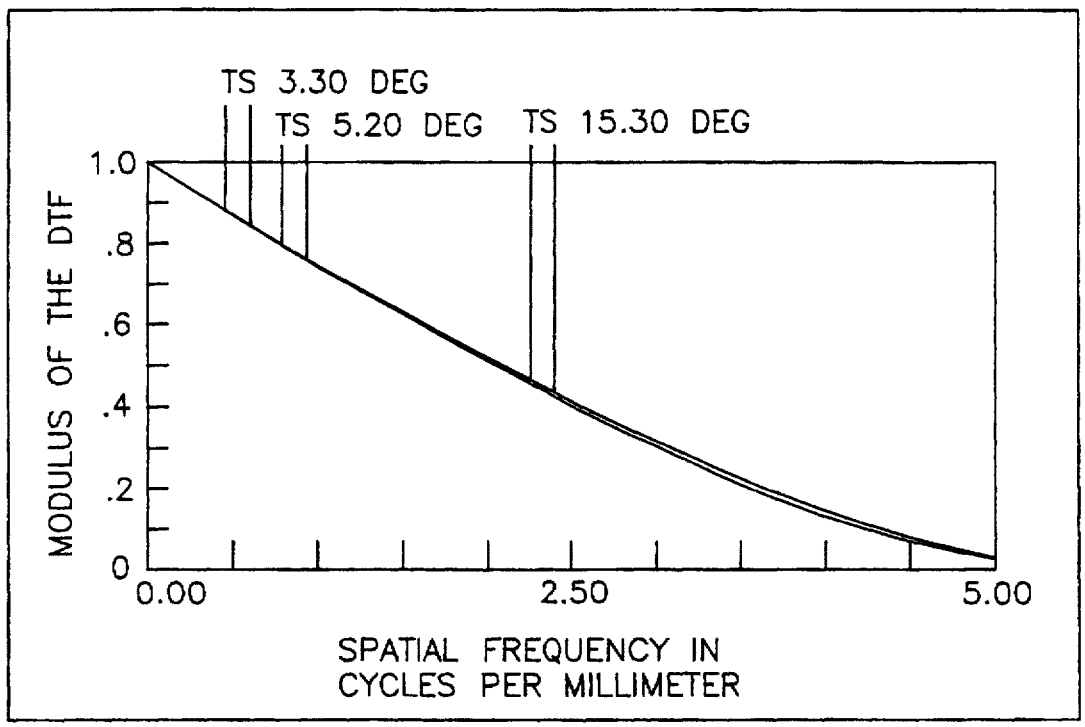
FIG. 47 is a plot of the modulation transfer function for a defocused paraxial lens only.
Figure 48:
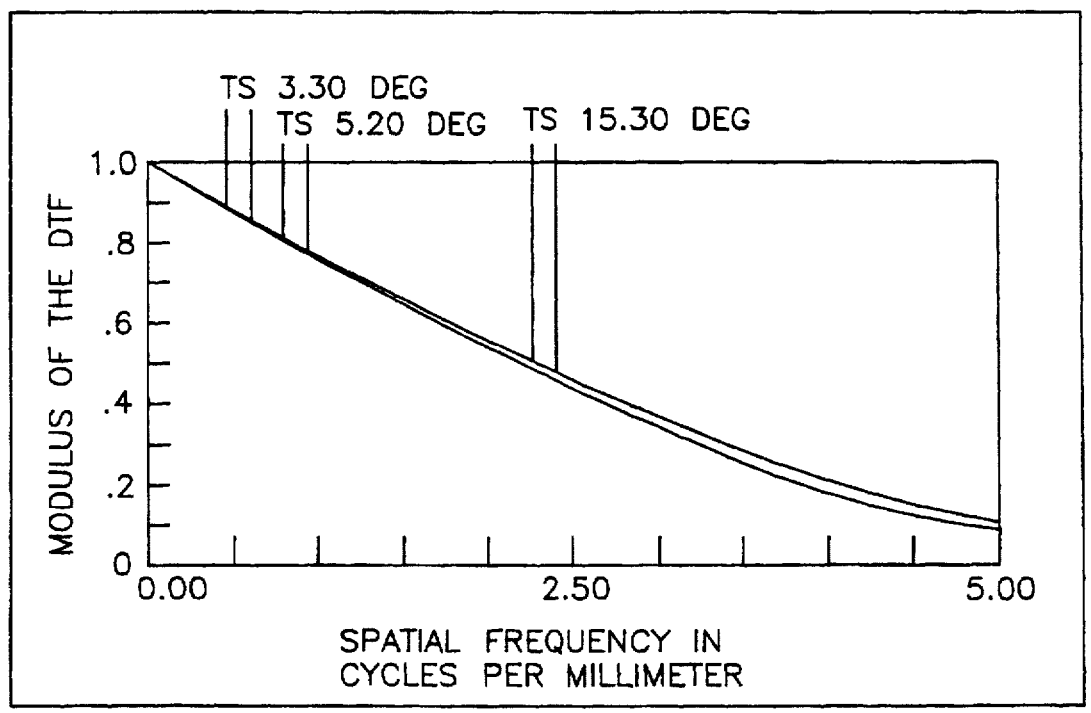
FIG. 48 is a plot of the modulation transfer function for a defocused Fresnel zone plate with a paraxial lens.

In order to verify the effect of the use of a Fresnel Phase Zone Plate (FPZP) for extending the depth of field in a CCD scanner such as in the inventive system, a computer simulation of a FPZP was run as an even order aspheric plate with three coefficients having zero power. A paraxial lens was located behind the FPZP and three imaging properties were examined. First, the off-axis imaging quality for rays 15° off-axis were examined and compared to those on-axis. The spot diagrams indicated that the image quality does not degrade. Next, the axial chromatic image shift for white light (450 nm to 650 nm) was examined and compared to single wavelength coherent light. The analysis showed that the image plane does not shift with color, indicating that the FPZP works with incoherent as well as coherent light. Lastly, the extension of the depth of field was examined by changing the object distance by an arbitrary amount and examining the modulation transfer function with and without the FPZP in the optical path. The comparison of the modulation transfer function for a lens system without and with the FPZP is provided in FIGS. 47 and 48, respectively, demonstrating an approximate 10% increase when the FPZP is added according to the present invention.

In the preferred embodiment, the FZP has fewer than ten zones and will have an internal transmission of 100%. The FZP can have modulations on the even periods and is described according to the following generalized equation:

$$FPZP_z = (c_s r^2)/(1 + (1-(1+k_s)c_s^2 r^2)^{1/2}) + \alpha_1 r^2 + \alpha_2 r^4 +, \quad (30)$$

where $c_s$ is the curvature of the Fresnel surface, r is the radius of the curvature of the zone plate, k is the conic constant of the Fresnel surface, and $\alpha_n$ are the constants of the coefficients in radians.

The window 24, as illustrated in FIG. 1, consists of a bandpass filter centered at the selected illumination wavelength, e.g., approximately 660 nm (for the visible light scanner), and a light homogenizer/diffuser, and may be combined with, or separate from, a cylindrical lens, which focuses the light along one axis to form a plane of light, with a line of light being created at its focal point. For example, the lens filters of FIGS. 5 and 17 provide the multiple function of homogenizing, diffusing and focusing by way of a cylindrical lens. When the bar code is scanned at the precise focal point of the cylindrical lens 38, the maximum possible light will be reflected to the detector. The window's function is to suppress radiation noise from the LEDs, to form a homogeneous incident beam for illumination of the bar code, to collimate the beam, and to filter the reflected light by removing extraneous light which falls outside of the predetermined acceptable bandwidth range of 660 nm.

In an exemplary embodiment, the window 24 is formed from water white float glass and is coated on both entry and exit sides for less than 1% reflectance within the wavelength range of 450–650 nm. The window should be durable, and tolerant of incidental contact without marked degradation. The size of the window is on the order of 1"×0.75", with a thickness of 0.9–1.0 mm. The window may be mounted with a slight tilt of about 5°–7° from normal incidence with respect to the PCB.

The cylindrical lens 38, as seen in FIG. 4, may be modified to provide a uniform distribution of light at the focal point. This "homogenization" is provided by knurling or scalloping the input side 90 of the lens, as shown in FIG. 14. Each step 92 in the knurled edge 90 acts as a "mini-lens" which spreads the light entering the cylindrical lens at that point. The spread light from each mini-lens overlaps other spread light to homogenize the light at the focal point of the cylindrical lens. The focal point of the cylindrical lens is determined by the outer side 94.

Figure 14A:
FIGS. 14a and 14b are diagrammatic views of a knurled cylindrical lens with a concave and convex output edge, respectively.
Figure 14B:

In conjunction with the knurled input edge, the output edge of the cylindrical lens can be either concave or convex. The concave edge 94' is shown in FIG. 14a, and the convex edge 94 is shown in FIG. 14b. The concave edge 94 is selected for scans of two-dimensional bar codes at distances from contact to 3 inches. The convex edge 94 is used for scan distances greater than 3 inches.

Figure 15:
FIG. 15 is a diagrammatic view of a double radius cylindrical lens.

Another modification of the cylindrical lens is illustrated in FIG. 15. The double radius creates, in effect, two separate cylindrical sub-lenses 96 and 98, each with a different focal length. The light emitted by the LEDs will be focussed by both sub-lenses 96 and 98 so that two different lines of focussed light are created at different angles from the lens, as shown in FIG. 17. This lens provides greater variability in the distance at which a bar code can be accurately read without requiring a change in the cylindrical lens or a compromise in the strength of the signal.

Frame locators may be provided to enhance the user's ability to correctly aim the scanner at the symbol or image to be scanned by the addition of one or more laser diodes which emit light in the visible spectrum to the optical scanning device. These laser diodes are mounted on the PCB with the other optical and electrical components, with voltage for powering the laser being provided by means similar to that for the LEDs, as is known in the art.

Figure 34:
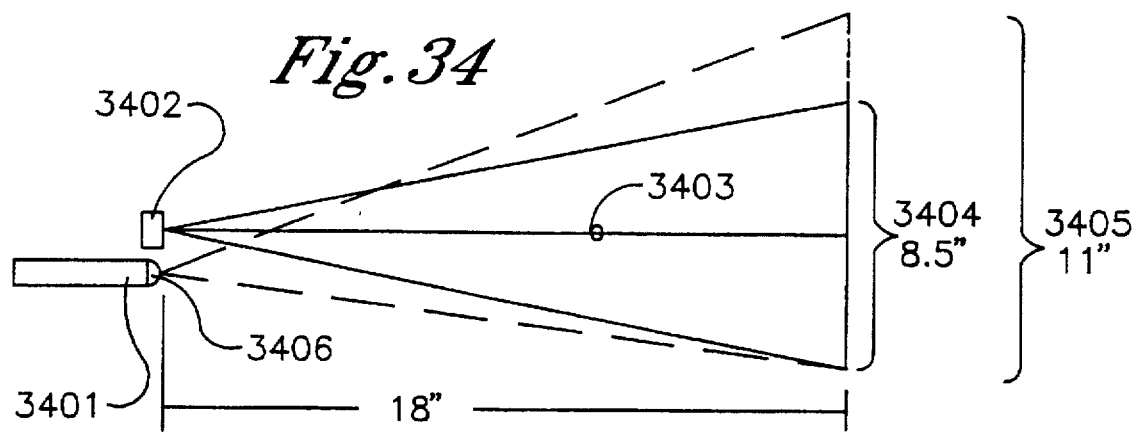
FIG. 34 is a diagrammatic view of a first embodiment of a frame locator for the present invention.

A first variation of the frame locator using a laser diode is illustrated in FIG. 34. Laser diode 3401 is placed offset from the optical axis 3403 of detector 3402. A diffractive optic 3406, either a diffraction grating (or pair of diffraction gratings) or a binary optic is located in the beam path of the laser diode 3401 to divide the beam into a plurality of beamlets, preferably four, expanding the effective beam path, i.e., the spacing between the beamlets, at substantially the same rate as the divergence of the field of view of the detector. Four beamlets are created by crossing two diffraction gratings at 90° to each other to create a two-dimensional diffraction grating. (The beamlets are indicated with dashed lines.) The expansion provided by optic 3406 causes the beamlets to define the edges of the field of view at the closest focus position of 2 inches, thus indicating the general area of the field of view to allow the scanner to be aimed correctly. For this purpose, the laser diode 3401 is offset from the detector 3402 by 0.5 in.. While this variation has the advantage of using only a single laser and minimal optics, the offset from the optical axis 3403 results in the dimensions of the illumination area 3405 being larger than the area of the field of view 3404, so the indication of the frame is not completely accurate. (As illustrated, there is a 2.5 inch difference toward the upper portion of the illumination area for a field distance of 18 inches.)

Figure 35:
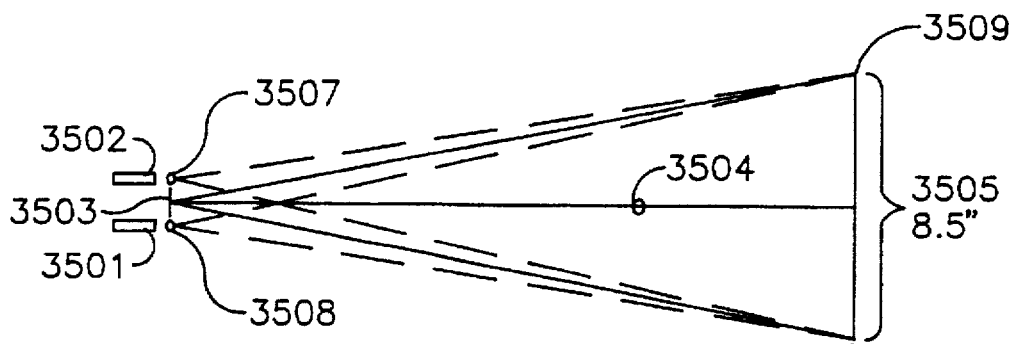
FIG. 35 is a diagrammatic view of a second embodiment of a frame locator for the present invention.

In FIG. 35, two laser diodes 3501 and 3502 are placed on either side of the detector 3503 so that they are centered on the detector's optical axis 3504. The beams emitted by lasers 3501 and 3502 are divided into beamlets by diffractive optics 3507 and 3508 to coincide with the field of view 3505 of the detector at the field distance of 18 inches. In this case, each of the diffractive optics is oriented in the same direction so that laser 3501 provides marks indicating the upper edge 3509 of the field of view 3505, and laser 3502 provides the marks for indicating the lower edge 3510 of the field of view 3505. However, when the field distance is shortened, the area defined by the spots of light produced by the beamlets will be larger than the detector's field of view, and the illumination is not uniform across the target area and may interfere with scanning. In order to avoid errors in the detected signal, the variation in brightness should be 2:1 or less.

Figure 36:
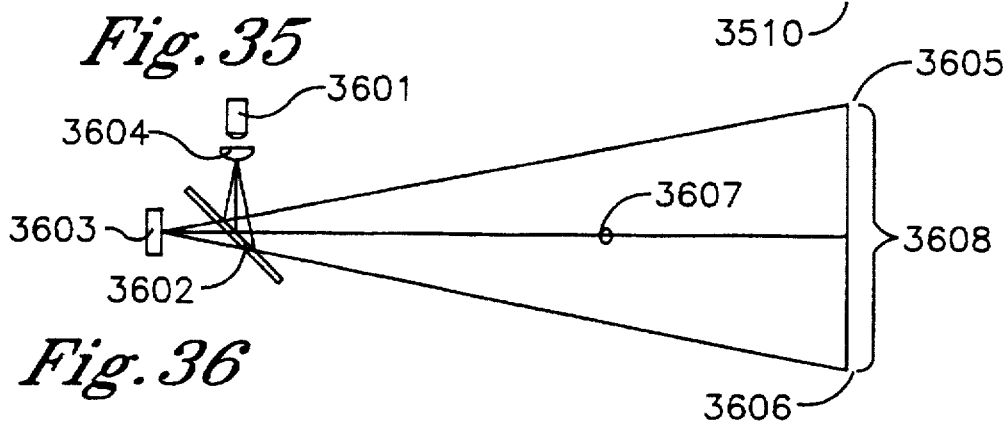
FIG. 36 is a diagrammatic view of a third embodiment of a frame locator for the present invention.

The variation of FIG. 36 provides a beam splitter 3602 to overlay the laser beam on the field of view 3708 by aligning the beam with the optical axis 3607 of detector 3603. The beam emitted by laser diode 3601 is divided and expanded by diffracting optic 3604 before being redirected by beam splitter 3602. This system allows the diverging beamlets to match the edge of the field of view of the detector 3603. An identifying mark could be placed at the edge of the detector field by including an additional diffraction grating on or near the beam splitter 3602 to form another point along the edge of the beam, e.g., at 3605 and/or 3606. A custom binary optic can be created to generate five beamlets, with the fifth beamlet providing the marker. A disadvantage of this system is that the beam splitter reflects 50% and transmits 50% of the light, so compensation should be made by selecting a sufficiently bright laser that 50% or less of the light intensity is sufficient to make the edge markers clearly visible.

Figure 37:
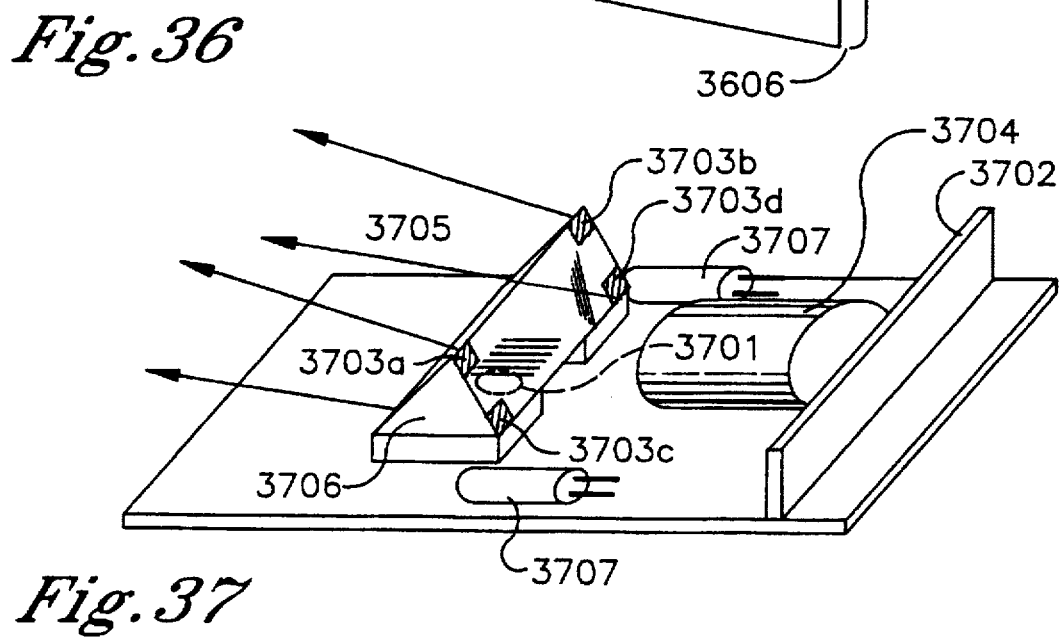
FIG. 37 is a perspective view of a fourth embodiment of a frame locator for the present invention.

The fourth variation, illustrated in FIG. 37, combines diffractive or binary optics 3705 with a mirror combination 3703a–d to create four spots for identifying the corners of the target area. The laser diode 3701 is expanded by optics 3705 (illustrated here as crossed diffraction gratings) at an angle of ±13.3°, to match the corners of the field of view. The mirrors 3703a–d are disposed on a plane of a transparent base mounting 3706 which allows reflected ambient and/or illuminating light to be transmitted through the base to the focussing optics 3704 and the detector 3702 with no or minimal loss. The plane on which the mirrors are mounted is angled so as to direct the diverging beamlets along a path centered along the optical path. The optical coatings by which the mirrors 3703a–d are formed can be selected to optimize reflection of the laser beam's wavelength, as is known in the art. In this variation, illumination for reading the scanned image may be provided by infrared LEDs 3707 mounted on either side of the frame locator assembly, so that the light from the frame locator can be readily filtered from the signal received by the detector by the appropriate bandpass filter. In the above variations, infrared LEDs may also be used in combination with the visible laser light of the frame locator. By using IR, the illumination is invisible to the user, so that it is no difficulty in matching the field of view exactly, as long as the entire field of view is covered by the frame locator.

For each of the above variations in which the laser beam is divided into diverging beamlets, the binary optics, Fresnel zone plates, i.e., a plate with four distinct zones—one for each beamlet, and/or diffraction gratings are conventional optical devices which are known in the art. All that is required is the transformation of a single collimated beam into a plurality of, and preferably four, collimated beams that are diverging from the optical axis at an angle to match the expansion of the field of view at increasing distance from the device, i.e., fixed angular distribution. A diffraction grating is ideally suited for this application since the first order beams should be of sufficient intensity to provide a pair of spots diverging in opposite directions. To provide four spots, two diffraction gratings can be overlaid at 90° to each other, using the first order, beams generated by each grating. In order to align the spots with the corners of the field, the grating assembly should be rotated 45° with respect to the rows and columns of the detector array.

Figure 38A:
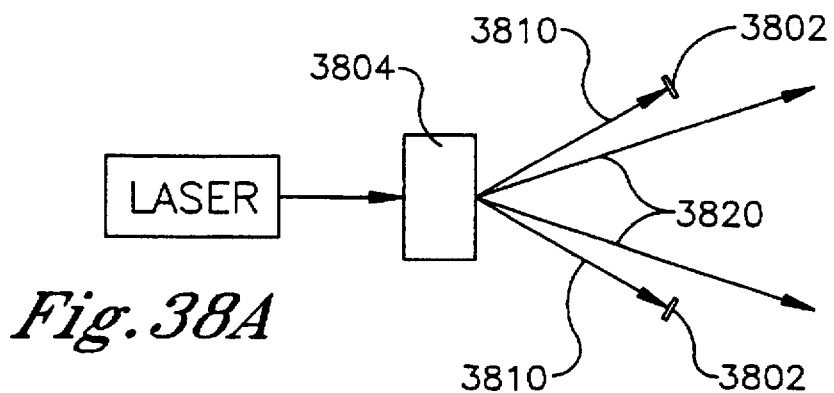
FIGS. 38a and b are diagrammatic views of a fifth embodiment of a frame locator for the dual focus embodiment, with FIG. 38a showing the narrow field frame locator and FIG. 38b showing the wide field frame locator.
Figure 38B:
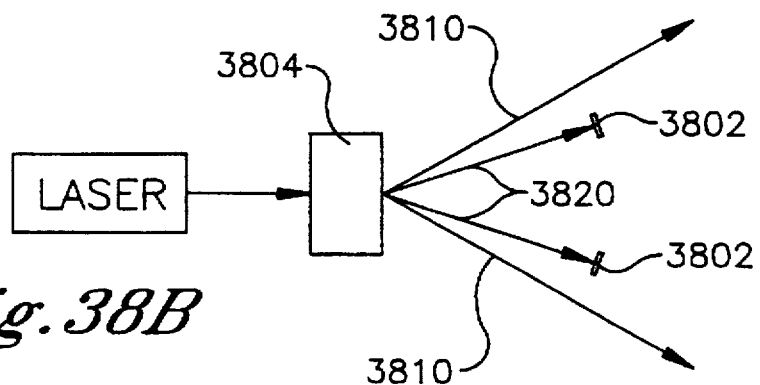

In the embodiment having dual field of view optics, two separate sets of diffractive elements can be provided to assure optimal correlation with the edges of the field of view at the two positions of the zoom lens. The separate sets of diffractive elements may be located on the same substrate 3804, as shown in FIGS. 38a and b, to simultaneously generate two sets of four beamlets, each set at different angles of diffraction to form a wide field and a narrow field. To avoid confusion to the user resulting from the presence of two sets of framing spots, as the zoom lens is adjusted to one field, for example, the wide field, the framing beamlets for the narrow field are blocked or deactivated. In an exemplary embodiment, blocking mask 3802, or perforated mask with holes to permit transmission of the beamlets, is in the form of a pivotable louver which has back-and-forth motion tied directly the motion of the zoom lens. As shown in FIG. 38a, when zoom position #1 is selected, blocking mask 3802 is positioned within the path of beamlets 3810 formed by diffractive element 3804, which provide framing for the wide field of view. This permits only beamlets 3820 for the narrow field of view to be projected forward. When zoom position #2 is selected within the dual focus optics, blocking mask 3802 is positioned within the path of beamlets 3820, permitting only beamlets 3810 to project forward to define the wide field of view, as illustrated in FIG. 38b.

In the preferred embodiment, the laser diode and aiming indicator optics have the following characteristics:

TABLE 8

| | |
|---|---|
| Packaging: | 7.0 mm dia. × 19 mm |
| System weight: | 7.5 gm |
| Supply voltage: | 3–12 VDC |
| Input current: | 75 mA max. |
| Peak output wavelength: | 670 nm |
| Peak intensity: | 3.0 mW, laser diode |
| Source distribution: | circular |
| Beam diameter: | 1.3 mm dia. |
| Projection lens: | fanout grating device (Dammon type) |
| Lens design: | refractive cylindrical/binary diffractive |
| Lens material: | fused silica, glass or photopolymer |
| Diffractive orders: | first only |
| Diffraction efficiency: | >87% total, all beams combined |
| Number of first order beams: | 8 |
| Diffracted angle: | equal to wide angle field of view and narrow field of view |
| Projected spot size: | 1.3 mm dia. |

Figure 19:
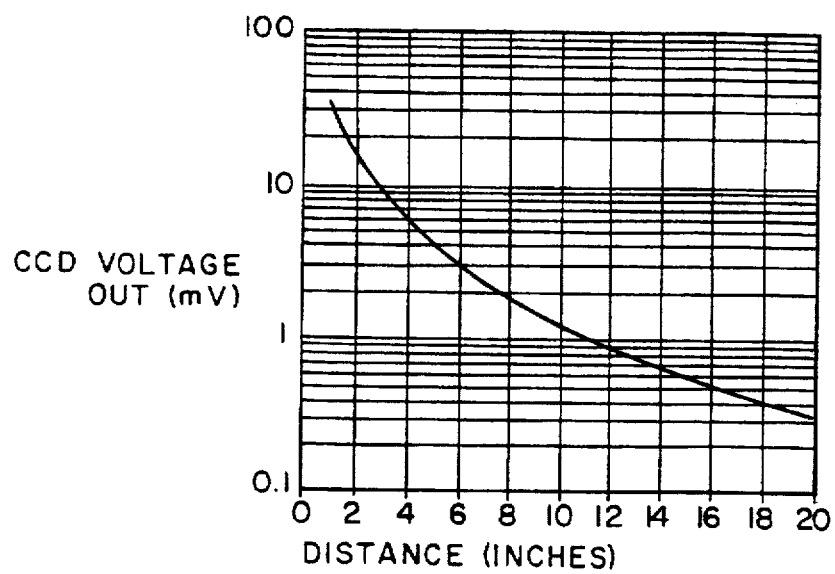
FIG. 19 is a plot of output signal voltage versus scanner distance from bar code.

The detector 20 consists of an array of charge coupled devices (CCD) which are arranged in equally spaced pixels, and may include additional processing elements such as shown in FIG. 19. The spacing of the pixels determines the limit of the resolution of the detector, so it is necessary to match the CCD resolution to the required spatial resolution in the image plane in which the detector lies. The magnification of the lens system is selected so that the received reflected light fills the detector array and so that at least 2 CCD pixels cover the minimum bar width to be resolved in the image plane. This is especially important for bar codes printed with a dot matrix printer.

The arrangement of the CCD array will depend on the application. For a one-dimensional bar code, a single linear array of CCDs is acceptable. For two-dimensional bar codes, a single linear array can be used by moving the scanning head from the top to the bottom of the bar code. However, to provide better resolution, two parallel lines of CCDs or a full area array of CCDs can be used. The use of multiple rows of CCDs permits use of an auto-correction technique in which the signal read by one row of CCDs can be double-checked by a second row. In the preferred embodiment, the CCD detector array has pixel elements with a 1:1 aspect ratio, i.e., square, for decoding symbologies regardless of orientation. This CCD array selected for this scanner has the following characteristics:

TABLE 9

| | |
|---|---|
| Pixel size: | 7.4 × 7.4 microns |
| Packaging: | 12.2 × 11.4 mm |
| Voltage: | 5V |
| Format: | 1/3" |
| Aspect Ratio: | 4/3 |
| Nominal sensitivity (with CM500 filter): | >60 mV/lux |
| Dark current voltage: | 2 mV |
| Saturation voltage: | 500 mV |
| Shutter: | variable 1/30 to 1/10,000 (does not require vertical synch signal)\Progressive Scan CCD |

Figure 12A:
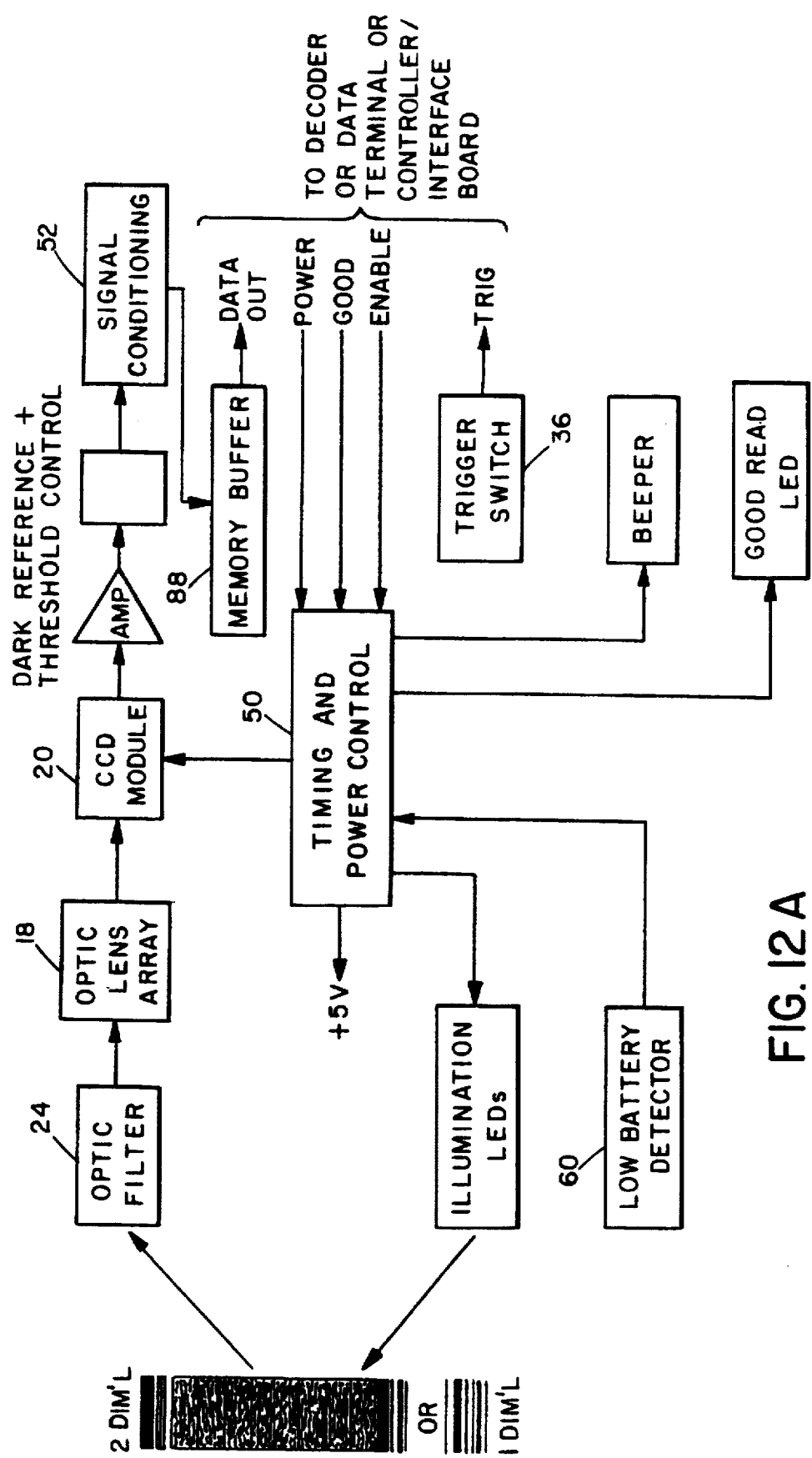
FIGS. 12a and 12b are alternate block diagrams of the scanning sequence.

In two-dimensional bar code readers, a memory buffer 88, shown in FIG. 12a, will store the two-dimensional image prior to decoding by decoder module 26.

Portions of the double line CCD array or the area array can be selectively turned on and off by connecting the CCD module controller to an external trigger or switch which has multiple selections. This will allow a one-dimensional bar code to be read by a two-dimensional scanner, while conserving power by using only as much of the CCD array as needed.

Further, the scan rate and the integration time of the CCD array is variable, established by programmable control of the number of clock cycles permitted for scanning and integration. Variation of scan and integration time is determined by feature size, density, clarity and distance of the symbol, as well as ambient light and other possible noise inducing factors. In the preferred embodiment, the scanner can read symbologies ranging from 6 mils up to 72 mils, with overall symbol dimensions of 0.25"×0.25" to 3"×3".

Three types of CCDs, which are known in the art, may be used for the area array of the two-dimensional bar code reader. The first type is the full frame CCD which has a single parallel register for photon exposure, charge integration and charge transport. A shutter is used to control the exposure and to block light from striking the CCD during readout.

The second type, the frame transfer CCD, has a parallel register which is composed of two CCDs that are arranged in tandem. One of these CCD registers is the storage array which is covered with an opaque mask and provides temporary storage for collected charge during readout. The other CCD register, the image array, is identical in capacity to the storage array and is used to collect the image. After the image array is exposed, the electronic image it generates is shifted into the storage array for readout. While the storage array is read, the image array can collect charge for the next image.

The third type of CCD is the interline transfer CCD. This CCD has a parallel register that is subdivided so that the opaque storage register lies between the columns of pixels. The electronic image accumulates in the exposed area of the parallel register. For readout, the entire image is shifted under the interline mask. The CCD shift register also lies below the interline masks. The readout occurs the same as in the frame transfer CCD.

Figure 16:
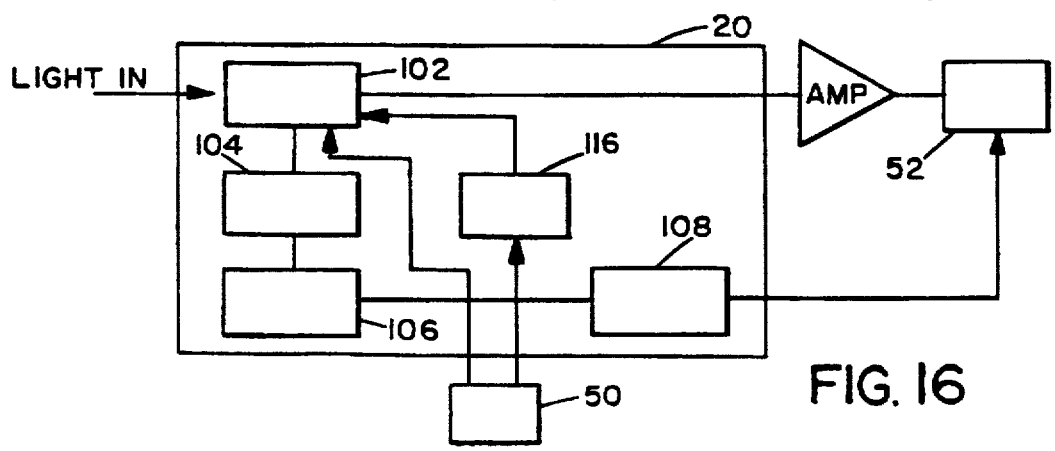
FIG. 16 is a block diagram of the CCD module.

The area array 102, which is included in the CCD module 20 illustrated in FIG. 16, operates in an interlaced mode. This mode consists of shifting the potential wells by one-half pixel in alternate fields, "fields" referring to the field of view of the scanning head. This shift is possible due to the multiple phase arrangement of gate structures in the CCD which allows sequential propagation of the collected charges in the potential wells, as is known in the art. This results in two successive fields containing different information, given a certain number of line images with reduced aliasing.

During the exposure or integration period, charge is accumulated on each pixel in proportion to the incident illumination. Every line includes a certain number of pixels. A transfer pulse will "readout" the charge on each line to generate an analog signal. The combined readouts of each line represent the two-dimensional bar code. The information will be conditioned and stored in memory buffer 88 in order to be decoded by decoder 26. After the transfer has occurred, the area array 102 will return to its integration state to accumulate charge for the next field.

In order to obtain the optimum performance, a calibration of the dark levels and shading correction must be made. A dark frame is stored and subtracted from an image to yield a zero reference.

A shading correction frame, or flat field, is required to make correction for variations in system responsivity. Because the CCD has excellent linearity, only one flat field must be taken to correct an image anywhere within the available dynamic range at a specific wavelength (660 nm). Shading varies with wavelength, and flat fields are often obtained at many wavelengths. A calibration sequence requires taking the image of interest $I_R$, a dark frame, $I_D$, and a flat field, $I_F$. An arithmetic pixel-by-pixel computation yields a corrected image with photometric integrity $$I_C=(I_R-I_D)/(I_F-I_D). \tag{31}$$

Selection of the CCD array is also influenced by the signal-to-noise ratio of a given device. In the first exemplary embodiment, a Sony ILX505 is used. The system parameters using the ILX505 are:

CCD sensitivity S: 21 V/lx-s at 3200K light source;

CCD relative spectral response: 1.0 at 475 nm, 0.65 at 650 nm;

Read out rate t: 36 frames/sec or integration time of 27.7 msec;

Dark voltage: 0.3 mV;

LED area $A_{LED}$: $2\times10^{-5} m^2$;

LED intensity I: 4000 mcd at 650 nm;

LED solid angle illumination ω: 8.0 deg or 0.015 steradians;

Diffuser transmittance $T_D$: 0.9

Diffuser area $A_D$: $1.5\times10^{-4}$ $m^2$;

Bar code reflectance $R_B$: 0.50;

Total Optical System Transmission (at 650 nm) $T_O$=0.70;

Optical system f/number: 22.0.

The applicable conversions are:

The CCD sensitivity at 650 nm is 21 V/lx-s×0.65=13.65 V/lm/m²/s;

the total intensity I of the LEDs is 8.0 lumens/sr for two LEDs only.

The total brightness onto the diffuser is:

$$\begin{aligned} B &= (I\omega/\pi A_{LED}) \\ &= (8.0)(.015)/\pi(2\times10^{-5}) \\ &= 1,905 \text{ lumens}/m^2 - sr. \end{aligned} \tag{32}$$

The total lumination onto the bar code is given by:

$$\begin{aligned} L &= T_D B A_D/R^2, \\ &= (.9)(1905)(1.5\times10^{-4})/(.177)^2 \\ &= 8.21 \text{ lumens}/m^2 - sr \end{aligned} \tag{33}$$

where R is the distance from the diffuser to the bar code.

The luminance L is, therefore, about 8.2 lumens/m²-sr at a distance of 7 inches away.

When the optical system images the bar code onto the CCD, the final illuminance is given by:

$$E_{CCD} = \frac{\pi L T_o}{4 (f/no.)^2 (1+m)^2}, \qquad (34)$$

where m is the system magnification. The illumination at the CCD is about 6.0E-3 lumens/m² for a magnification of 0.3.

The CCD converts the illumination into a voltage signal given by the following equation:

$$V_{out} = E_{CCD} S\, t, \qquad (35)$$

where S is the sensitivity and t is the integration time. The result above indicates a signal of about 2.0 mV and, therefore, a SNR of 6.67 for a readout rate of 36 frames (scans) per second. A plot of voltage output of the CCD with distance of the scan is provided in FIG. 19.

The end-to-end simulation of an imaging CCD array reading a high spatial resolution target can be simulated by treating the individual system components as a Fourier transform operator on the input optical signal. The four main components are the input bar code, the optical lens, the readout decoder electronics and the CCD array. Since operations occur in the spatial domain, the overall system transfer function is the product of the individual components. Expressed mathematically, $$O(f) = I(f) L(f) R(f) CCD(f) \qquad (36)$$

where:

O(f) is the output signal in spatial domain for a degraded bar target;

I(f) is the input bar target spatial frequency dependent on the smallest bar code;

L(f) is the lens spatial resolution or MTF;

R(f) is the readout electronics or transfer MTF; and

CCD(f) is the CCD spatial frequency or CCD MTF.

From the geometry of the CCD array, $$MTF = \mathrm{sinc}\left(\frac{f\pi x}{f_{max} p}\right) \qquad (37)$$

where:

p=cell periodicity x=cell dimension in the x-direction $f_{max}=1/p$ when p=x.

From detection theory, the output signal in spatial frequency must have a value of 0.1 for useful discrimination, i.e., O(f)=0.1. Therefore, if I(f)=0.55 (the contrast of the dark to light bars at 0.660 μm), R(f)=0.95 and CCD(f)=0.95 then L(f) must be >0.20 for all positions of the bar code object position.

The above includes all system components that can degrade the resolution of a perfect bar code. A term is added to include the magnification effect that occurs for a finite object as its distance to the first lens surface is varied. The limiting discernable image bar size is equal to its object size times the optical system magnification. For example, for a 0.006 inch (0.150 mm) object bar and a system magnification of 0.5, the image bar size is 0.075 mm. This is the same as 26.66 l/mm. Therefore, the lens must have the response L(26.66)=0.2, which can be expressed mathematically as:

$$L(2/obj \times mag) > 0.2 \qquad (38)$$

where:

obj is the x-dimension of the smallest bar to be read; and mag is the magnification for the optical system.

The image of a point formed on an x,y plane can be calculated as a modulation transfer function in spatial frequency. If P(x,y) is, by definition, the point spread function, that is the distribution of points of ray intercepts at the image plane, then the line spread function is the integral of the point spread function in one direction. Therefore, $$L(x) = \int P(x,y) dy. \qquad (39)$$

The modulation transfer function (MTF) which determines the spatial resolution in one direction is given by:

$$MTF(f) = [A_c^2(f) + A_s^2(f)]^{1/2} \qquad (40)$$

where, $$A_c(f) = \frac{\int L(x) \cos(2\pi f x) dx}{\int L(x) dx} \qquad (41)$$

$$A_s(f) = \frac{\int L(x) \sin(2\pi f x) dx}{\int L(x) dx} \qquad (42)$$

If the origin of the x,y coordinates is placed at the centroid of P(x,y), then the function $A_s(f) \to 0$. The expression for MTF can be approximated by:

$$A_c(f) = 1 - 2\pi^2 f^2 \left[\frac{\int L(x) x^2 dx}{\int L(x) dx}\right] \qquad (43)$$

or $A_c(f)=1-2\pi^2 f^2 B_x^2$, where $B_x^2$ is the rms blur of L(x). The relation between the point spread function P(x,y) and the rms blur of the image point is given by:

$$B = (B_x^2 + B_y^2)^{1/2}. \qquad (44)$$

The range over which an imaging bar code reader can function is dependent upon four variables, which are: 1) input bar code spatial frequency, 2) resolution of the optical lens, 3) resolution of the CCD, and 4) contrast of the bar code. With the assumption that high quality bar codes will be read, the contrast can be considered to be 1.0 over all spatial frequencies. (For poor quality bar codes, the contrast can drop to a value of 0.5 over all spatial frequencies.) The CCD with an 11 micron pixel pitch and spacing has an MTF of approximately 1.0 over the spatial frequencies that correspond to commonly used bar codes. (For a CCD with an 8 micron pitch and spacing, the MTF would be slightly higher but almost the same, because bar codes are being read with a spatial frequency of less than 20 line pairs per millimeter.) The two variables left as a function of each other are the bar code spatial frequency at the image plane and the degraded resolution of the lens as a function of object position. Since we are concerned with imaging objects over finite extents, we must compute the magnification (or reduction) at the image plane over the expected object distances.

The magnification of a lens system having a focal length of f=35 mm and with a nominal 30 degree total field of view used with a 28.5 mm CCD was computed from exact ray tracing over a range of object distances corresponding to 0.5 inches to approximately 20 inches from the front surface of the scanner. The magnification is selected so that, for a given distance, the complete area of the CCD array is filled up with the bar code image. This efficient use of the detector allows the maximum possible depth of field. These magnifications are listed in Table 10. The resulting spatial frequency in lines per millimeter is given by:

$$F_s = 1/(\text{magnification})(\text{bar width}). \quad (45)$$

This, in effect, determines the minimum spatial resolution that must be decoded. For example, for a 13 mil (0.013") bar code at a distance of 4 inches from the scanner head, the optical resolution must be greater than 1/(0.38)(0.33 mm), or, 8 line pairs/mm. See FIG. 23 which shows that at 8 line pairs/mm, the contrast for a square wave (bar code) input of 0.91 meets the criteria of having a contrast greater than zero.

The resolution of the optical system for any object distance is determined from a square wave modulation transfer function calculation.

This is the Fourier transform of the image spot size for a square wave input (i.e., bar target or bar code), which yields the spatial frequency of the spot size in lines/mm. This degraded resolution (for an object not at best focus) must be greater than the minimum required resolution. For example a maximum resolution in excess of 20 lines/mm for an object distance of 4 inches is shown in FIG. 23. This would mean that all bar codes are capable of being decoded at this object distance, since the highest minimum resolution required is 17.5 lines/mm (for a 6 mil bar code). Table 10 shows that the maximum number of the highest resolution necessary to decode a bar code of 6 mil or lower density should be 17.5 line pairs at 4 inches. FIG. 23 is the imaging diffraction square wave MTF at 5.5 inches from the scanning head, which shows the spatial resolution for all frequencies (or bar densities) at 4 inches for a 20 line pair/mm code is 0.78, which is greater than zero and can thus be decoded at 4 inches. As another example, at 2 inches away, the maximum resolution is zero at approximately 5.5 lines/mm. Point B on Table 10 shows all bar codes can be decoded except the 6 mil bar code because it has a minimum necessary resolution of 11.3 line pairs/mm, whereas all other bar codes have a minimum necessary resolution less than 5.5.

TABLE 10

| Distance (inches) | mag. | minimum resolution required(lines/mm) | | | | |
|---|---|---|---|---|---|---|
| | | 6 mil | 13 mil | 30 mil | 44 mil | 72 mil |
| 0.5 | 2.1 | 3.1 | 1.4 | 0.6 | 0.5 | 0.3 |
| 1.0 | 1.1 | 6.0 | 2.7 | 1.2 | 1.0 | 0.5 |
| 1.8(B) | .59 | 11.5 | 5.1 | 2.2 | 1.9 | 0.9 |
| 2.4 | .51 | 13.1 | 5.9 | 2.6 | 2.2 | 1.1 |
| 3.4 | .42 | 15.9 | 7.2 | 3.1 | 2.7 | 1.3 |
| 4.0(A) | .38 | 17.5 | 8.0 | 3.4 | 2.9 | 1.4 |
| 4.4 | .36 | 18.5 | 8.4 | 3.6 | 3.1 | 1.5 |
| 5.4(nominal) | .31 | 21.5 | 9.8 | 4.2 | 3.6 | 1.8 |
| 6.4 | .28 | 23.8 | 10.8 | 4.7 | 4.0 | 2.0 |
| 7.4 | .25 | 26.7 | 12.1 | 5.3 | 4.5 | 2.2 |
| 8.4 | .23 | 29.0 | 13.2 | 5.7 | 4.8 | 2.4 |
| 9.4 | .21 | 31.7 | 14.4 | 6.3 | 5.3 | 2.6 |
| 10.4 | .19 | 35.0 | 15.9 | 6.9 | 5.9 | 2.8 |
| 11.4 | .18 | 37.0 | 16.8 | 7.3 | 6.2 | 3.0 |
| 12.4 | .17 | 39.2 | 17.8 | 7.7 | 6.6 | 3.2 |
| 13.4 | .16 | 41.7 | 18.9 | 8.2 | 7.0 | 3.4 |
| 14.4 | .15 | 44.4 | 20.2 | 8.8 | 7.5 | 3.6 |
| 15.4 | .14 | 47.6 | 21.6 | 9.4 | 8.0 | 3.9 |
| 16.4 | .13 | 51.3 | 23.3 | 10.1 | 8.6 | 4.4 |
| 17.4 | .125 | 53.3 | 24.2 | 10.5 | 8.9 | 4.6 |
| 18.4 | .12 | 55.5 | 25.2 | 11.0 | 9.3 | 4.6 |
| 19.4 | .115 | 58.0 | 26.4 | 11.4 | 9.7 | 4.8 |

By utilizing the information provided in Table 10 and in FIGS. 20–25, it is possible to determine the criteria for acceptable resolution of any given bar code or similar symbol at distances of up to 20 inches and field angles up to ±15° (total field of 30°). This wide field of view also allows bar codes to be read at a range of pitch and skew angles without requiring perfect alignment of the scanner with the surface on which the code is affixed.

In the preferred embodiment, cost was added to the above-stated factors in selecting the CCD detector. Further, in order to permit scanning at any orientation, the detector array required square pixels.

Four CCD arrays were considered in making an initial selection: 1) Texas Instruments TC 237, Sony ICX084AL, Philips FT12 and Thompson-CSF THX 7887A. Based upon cost criteria, the first two were examined. Following this, the single most important criterion in selecting the array was that it was a black and white sensor, since this type of CCD has greater sensitivity. For colored symbologies, a different sensor would be used. Comparing the Sony black-and-white versus color sensors, the former had a sensitivity of 600 mV while the latter had responsivity of 450 mV.

Since the illuminating light is red, e.g., 660 nm, the responsivity at this wavelength is of prime importance. Texas Instruments provides a spectral responsivity plot with a 2.0 V/W/m² for their CCD measured with a CM500 filter. For the Sony CCD, the total spectral responsivity stated is 700 mV, which is also covering the entire spectral band. Sony uses an illumination box with a 3200K white light source having 706 cd/m², or 706 lumens/sr/m², with an f/8 lens (0.0156 sr) having an IR cut-off filter. The total sensitivity through the lens is then 706×0.0156 or 11.0 lumens/m² or lux. The sensitivity is the total responsivity divided by the total illumination, or 700/11=63 mV/lux. To convert lumens to watts, it is necessary to divide the sensitivity by 1/680 lumens/W, which yields 42 V/W/m². However, this is the sensitivity at the green wavelength, and a factor of 0.6 is necessary to reflect the relative response curve for the CCD at 660 nm. Additionally, another factor of 30/250 must be used to convert the 30 frames/sec and the shutter speed of 1/250 seconds to the effective integration time. Doing this yields an effective spectral responsivity at 660 nm of 42×0.6×30/250=30 V/W/m². The Sony CCD is, therefore, more sensitive to red LED light. Furthermore, it is even more sensitive at 590 nm, which is the preferred illumination wavelength.

The Sony CCD has a dark current voltage of 2 mV, while the Texas Instruments device has a value of 1 mV. This noise floor for either device is acceptable for the scanner of the preferred embodiment.

The resolution of the Sony and Texas Instrument devices are determined by the element spacing and the total number of pixels. Both the Sony and the Texas Instruments CCDs have 7.4×7.4 micron pixels. The Sony device has a total of 659 (H)×494 (V) pixels, while the Texas Instruments device has 658 (H)×496 (V), making them virtually equivalent. The modulation transfer function (MTF) of the two devices, which is based upon fill factor, pixel size and charge transfer efficiency, was the same.

The saturation voltage of the two devices was compared, with Texas Instruments having a value of 330 mV and the Sony having 500 mV. Since scanning in sunlight or other high ambient light conditions is a potential saturation problem, the higher saturation voltage was deemed more desirable.

The dynamic range of the two devices was calculated by taking the logarithm of the dark current voltage divided into the saturation voltage and multiplied by 20. The Sony device had a range of 48 dB and the Texas Instruments device had 50 dB, making them substantially equal.

Based upon the above considerations, the Sony device was identified as being more desirable for use in the scanner of the preferred embodiment. An additional factor favoring the Sony device was the it has a random shutter function so that it does not require a vertical synchronization signal and can reset itself after the first complete clock cycle. Further, it requires only a single driver device, therefore minimizing packaging space.

Now looking to the electrical components of the scanner, the drive clock sequencer and synchronization module 106 utilizes a single quartz crystal or external clock to provide all necessary logic and synchronization signals. A TTL/MOS buffer 104, as is known in the art, is included as an interface between the area array 102 and the sequencer module 1 06.

A pixel defect corrector 108 is included in the CCD module to manage pixel defect correction. It operates by replacing the signal of the defective pixel or pixels on a line with the signal produced by the last non-defective pixel.

Electrical power is provided to the CCD array by D.C. source or battery 46. In a first embodiment of the invention, the supply of power to the CCD array is coordinated by a clocking signal with the sequential or graduated illumination of the LEDs. Specifically, as seen in FIG. 7e, a clock signal (from clock 50) is provided to the CCD array to clear it in coordination with the activation of the LEDs. The CCD array can be scanned at a variable rate, from 36 to 200 scans per second, with the rate being determined by the density of the bar codes being scanned and the optical signal-to-noise ratio. The scan rate is set by the system clock which then modifies the illumination sequence of the LEDs so that the coordination illustrated in FIGS. 7a–7e will be maintained. The determination of scan rate can be pre-programmed and can be initiated by scanning a bar code with the scanning rate set-up information, or other relevant information, prior to measurement of the bar codes of interest.

Figure 8:
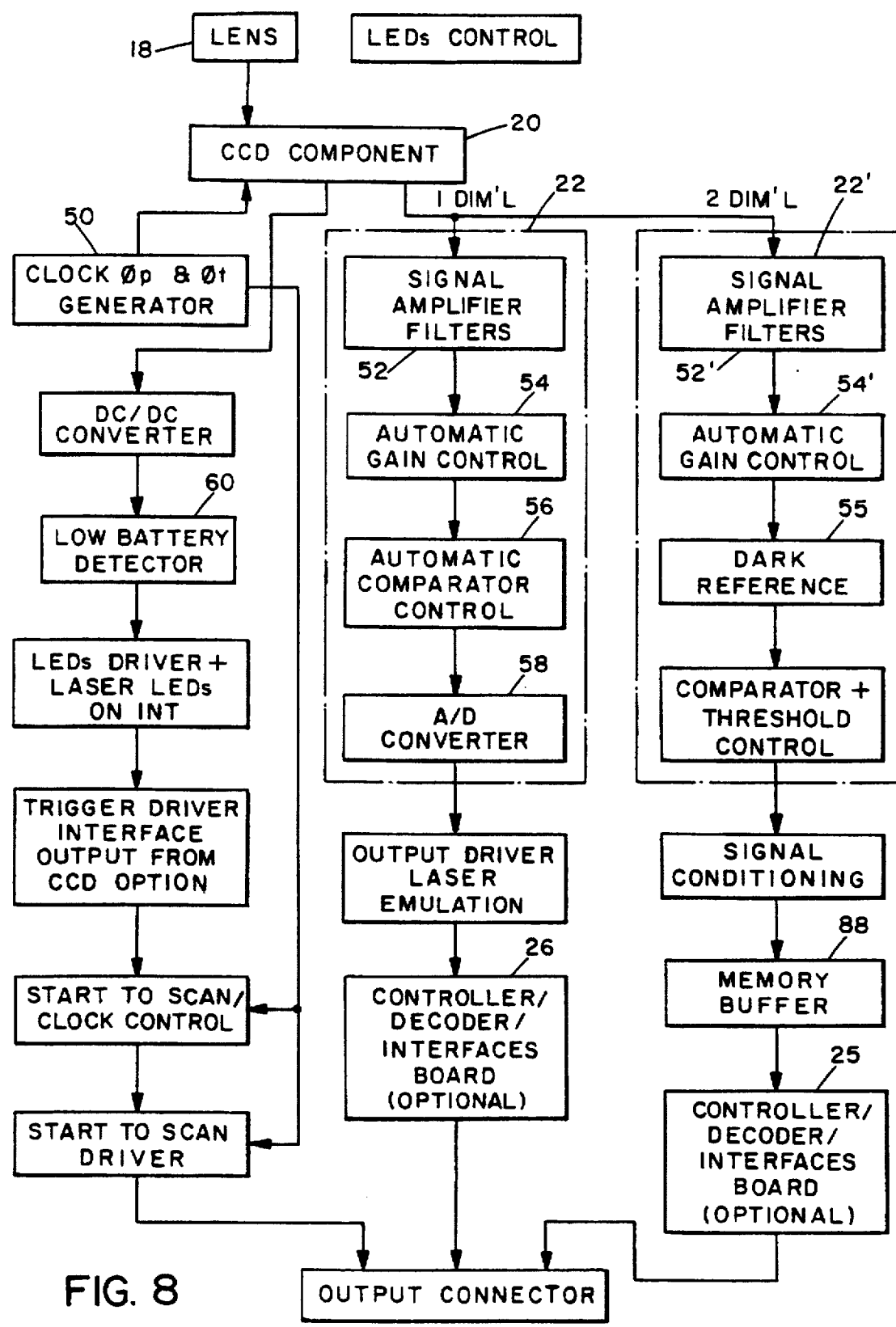
FIG. 8 is a block diagram of the operational sequence of the optical scanning head according to the present invention.

The processing sequences are shown in FIGS. 8 and 12. The signal provided by the CCD array will be amplified then processed through a low pass two pole filter and a high pass (25 KHz–30 KHz) five pole filter (shown combined as filter 52) which will extract the useful signal any noise generated either by the incoming light or by the CCD array itself. An optional automatic gain control (AGC) 54 will adjust the level of the signal to a pre-determined level. The level of the signal entering the AGC is a function of the distance at which the bar code is scanned. The greater the distance that the scanner is held above the scanned code, the weaker the signal will be. A filtered signal will then provide a voltage to a circuit which determines the real time center point ("zero crossing") reference level to a comparator with a gain of 500,000 which will convert the analog video output signal to a digital signal representing the bar code. The use of an automatic comparator control (ACC) 56 will avoid noise generated by hysteresis and will avoid missing the white guard and the first commutation which represents the first bar in the video signal. The signal is then converted from analog to digital by A/D converter 58 and sent to decoder 26. The reference voltages to the A/D converter are selected to maximize the full scale range of the A/D converter for the offset voltage from the CCD array. The $-V_{REF}$ for the A/D converter may be made programmable to maximize the sensitivity for low light level situations. The output of the A/D converter will be latched for reading by the microprocessor, so the output value may be read while the next conversion is in progress. The analog voltage data received from the CCD array is processed by the software executing on the microcontroller. The software provides an edge detection algorithm utilizing dynamic hysteresis based upon a histogram sampling method. The interpreted edges of light and dark are output in real-time to a TTL output pin that feeds the processed signal to the bar code detector. A video signal processing module, as is known in the art, may also be used to process the analog signal to provide a digital output data stream and/or to decode and provide a signal representing the decoded information within a two-dimensional bar code.

In an alternate embodiment, rather than sequentially illuminating the LEDs, the voltage to the LEDs is regulated in response to the signal level in the detector. The stronger the received signal, the lower the intensity of light required from the LEDs. The strength of the signal is dependent upon the distance between the scanner and the bar code, so, at the maximum scanning distance, the LEDs will receive full power. This conserves power by only demanding the power that is necessary. It also avoids saturating or distorting the detected signal if the bar code is read at a short distance from the scanner with high intensity light.

Figure 6:
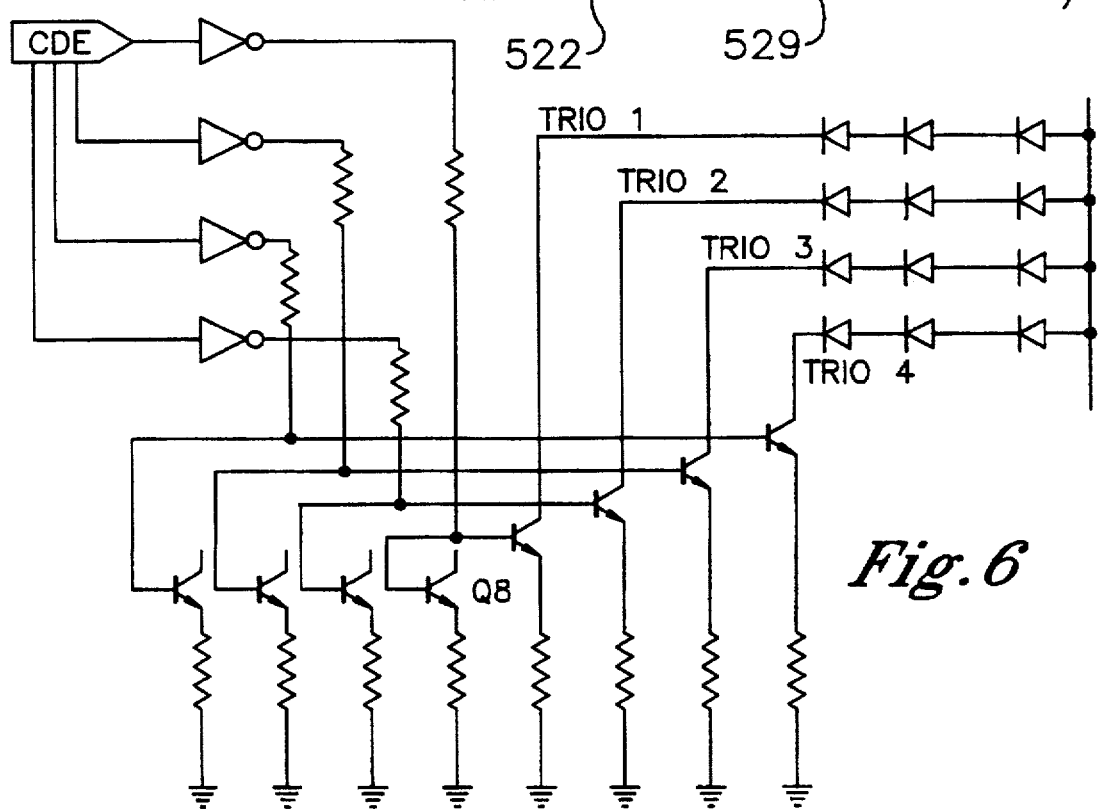
FIG. 6 is a circuit diagram of the LED board for the 12 LED configuration of FIG. 1.

The optical scanning head of the present invention provides for conservation of power supply energy by using a system clock to control a scanned, progressive illumination of the LEDs in coordination with clearing of the CCD array. The circuit diagram in FIG. 6 is provided to illustrate the sequential control of the four different LED trios which are illustrated in the embodiment of FIG. 1. For example, the clock driver provides a signal to activate amplifier U2A which then provides a signal to the first trio, identified as TRIO 1, to illuminate LEDs 5, 6 and 12. TRIO 1 is connected so that it will be on at all times that the scanner is activated, regardless of which other trios are on (note the base-collector short at transistor Q8).

FIG. 7 provides samples of pulse patterns for activation of the LEDs of the embodiment illustrated in FIG. 1. FIG. 7a illustrates the activation of the scanner at the beginning of a first clock pulse, i.e., the power is turned on. According to the pulse pattern illustrated in FIG. 7b upon application of the "turn on" signal, first trio of LEDs (TRIO 1) is illuminated. At the beginning of the second clock cycle a second trio (TRIO 2) is illuminated. Also at this time, a signal is provided to the CCD array to reset it to initiate its detection function, shown in FIG. 7e. At the beginning of the third clock cycle a third trio of LEDs (TRIO 3) turns on, and during a fourth clock cycle a fourth set of LEDs (TRIO 4) turns on. During the fifth clock cycle TRIO 2, TRIO 3 and TRIO 4 turn off and only TRIO remains on. This step up/drop down sequence is continued until the trigger is turned off at the point illustrated in FIG. 7a. In FIG. 7c a second possible pulse pattern is illustrated in which the first trio of LEDs turns on during the first clock cycle and a second LED trio turns on the second clock cycle, then turns off in the third clock cycle so that the first trio remains on until the seventh clock cycle when the second and third trios turn on for a single clock cycle. The first trio of LEDs remains on during the entire procedure and in the twelfth clock cycle, all four trios of LEDs turn on for one cycle. After a single clock cycle, where only the first set of LEDs remain on, the sequence repeats. In FIG. 7d the pulse pattern alternates between two trios of LEDs being on and turning on four trios of LEDs, with one trio being on at all times. For comparison of the inventive method to prior art practices, FIGS. 7f and 7g are provided. In FIG. 7f, a simple alternation occurs between on and off. In FIG. 7g, any combination of the LEDs remains on at all times that the trigger is activated.

In an alternate embodiment, power conservation is achieved by regulating the voltage supplied to the LEDs in response to the level of the signal generated by the detector array. As above, the detector signal level is dependent upon the distance at which the bar code is scanned. For greater distances, the signal level will be lower. In response to this lower signal, the voltage supplied to the LEDs will be increased. When the signal level is above a pre-determined limit, the voltage supplied to the LEDs will be less, since less light is needed to provide an acceptable signal. As an example, if the bar code is read at close range, the LEDs will be supplied with a 25% of the maximum current drain, which, in the prototype device, is 5 mA. If the bar code is read within the middle of the total field depth, the LEDs receive 50%, or 10 mA. At the outer limits of the field depth, the supplied current will be 20 mA. The percentage of power applied to the LEDs may change with the color of the bar code as needed to obtain the optimal light intensity for scanning. This power management technique will use the level of the video output signal to command and control the current on the LEDs through an appropriate clocking function.

Figure 9:
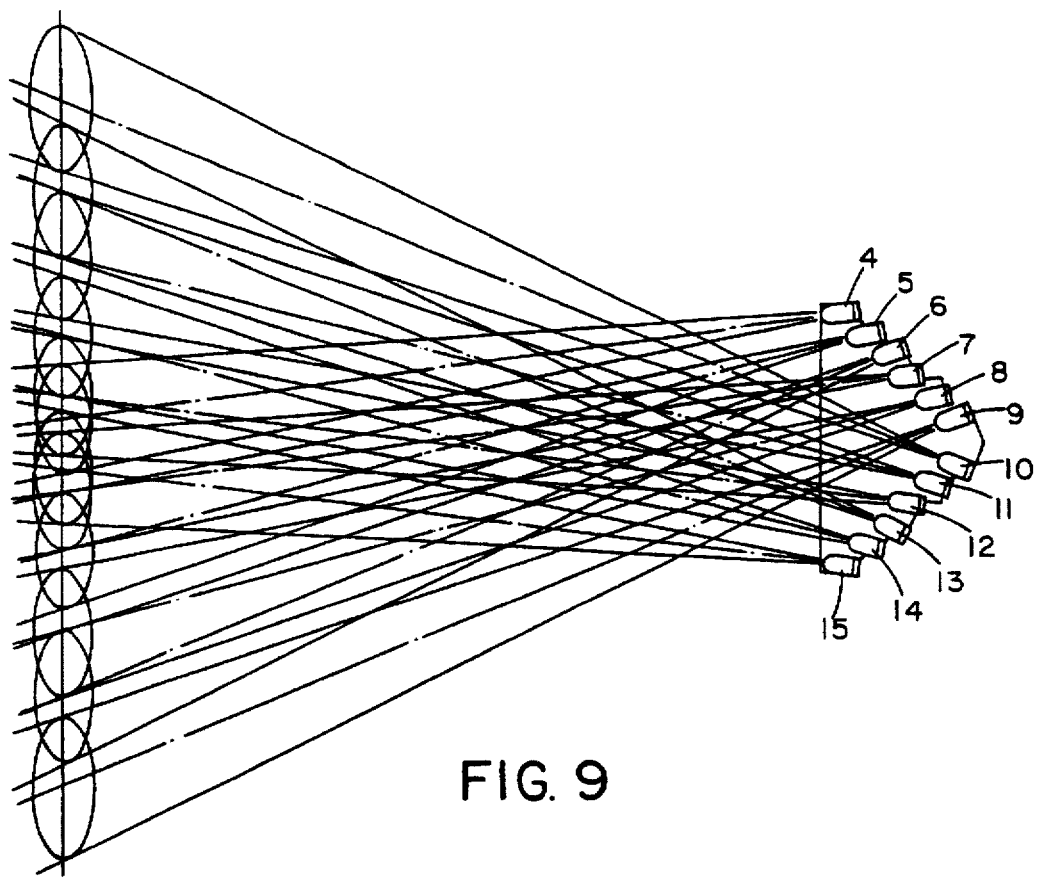
FIG. 9 is a diagrammatic view of an alternate LED layout and the corresponding light distribution.

The light path of the incident beam at the front region of the scanner will generate a beam of light through angular distance over a field of view across the bar code symbol located in the vicinity of the reference plane. The width of the light transmissive window 24 represents a limiting factor for the width of the incident beam. For this reason, the LEDs are mounted as close as possible to the window 24 to optimize the field of view and the incident beam power. Despite this limitation, the field of view of the incident beam is generally independent of the width of the PCB 2 or of the housing. This permits the field of view, i.e., the transverse beam dimension of the incident beam to be larger than the width of the window 24. This is due to the fact that the LEDs emit the incident beam at different directions from each side of the device within the scanning head. The LEDs are oriented to provide parallel beams in pairs. For example, a first pair of LEDs, LEDs 4 and 7 are oriented at a 7.5° angle on the y-axis (a line normal to the front of the PCB 2), 5 and 8 are oriented at 15°, and LEDs 6 and 7 are oriented at 22.5°, as illustrated in FIG. 9. The LEDs on the other leg of the "V" are similarly oriented in the opposite direction. As can be seen in the figure, the fan of light which results from this orientation provides an intensity distribution which is higher within a narrow region at the center of the fan, as determined at a distance of 7 inches from the scanner.

Figure 10:
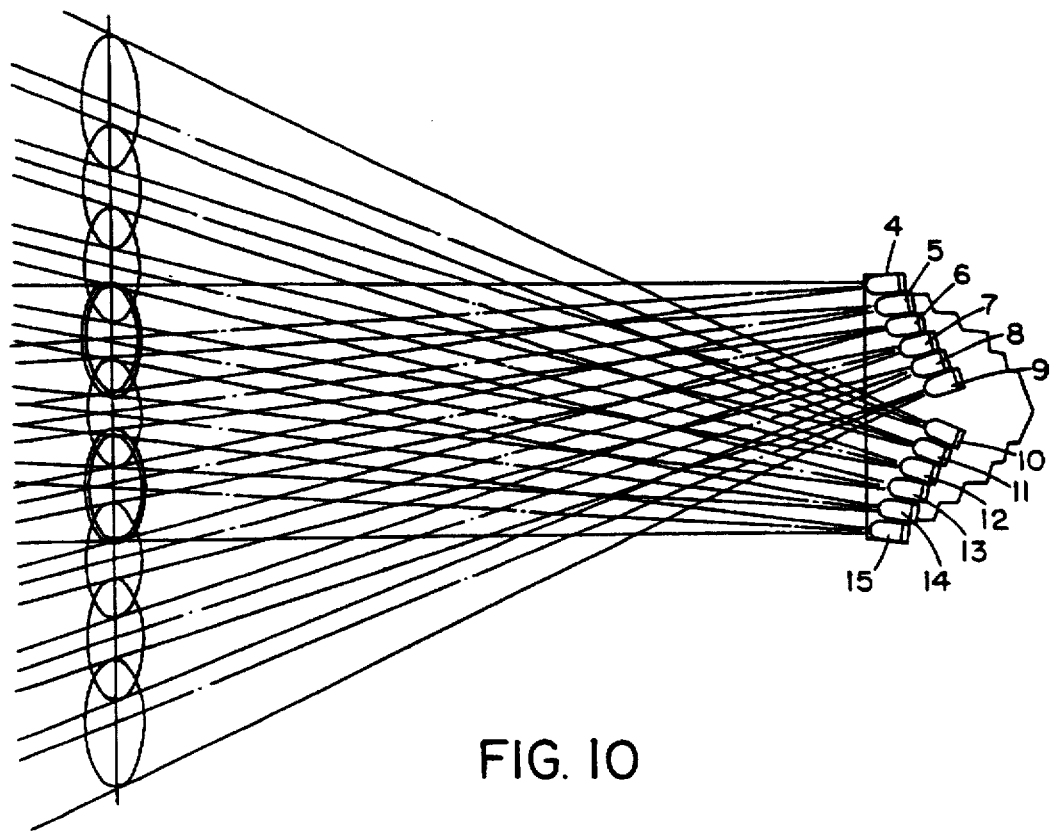
FIG. 10 is a diagrammatic view of a second alternate LED layout and its corresponding light distribution.

The alternate LED arrangement shown in FIG. 10 places the centermost LEDs at an angle of 3.75° from a line normal to the front of the scanner, with the other LEDs being oriented at 3.75° increments as they progress outward along the legs of the "V". This LED configuration results in a slightly wider region of higher intensity as compared to the above-described embodiment. It should be noted that the cylindrical lens 38 should be positioned at a distance from the LEDs corresponding to the location where the beams cross to provide the highest intensity, e.g., location 120 in FIG. 10.

A third configuration of the LEDs is illustrated in FIG. 11, which shows a line of LEDs at varying orientations. This configuration is described above, as is the fourth configuration illustrated in FIG. 27.

Other electrical sub-circuits can also be provided on PCB 2, including the analog filter 50 and A/D converter 52. However, in order to configure the housing of the scanner in desired position, it may be necessary to provide a second circuit board oriented at some angle to the first circuit board onto which additional subcircuits can be placed including a decoder chip and a memory device. For example, two circuit boards can be configured so that one abuts the other at approximate right angles to create an "L"-shaped arrangement. This arrangement would allow placement of one of the boards in the barrel of a scanning gun with the other board extending partially into the handle portion.

Figure 12B:
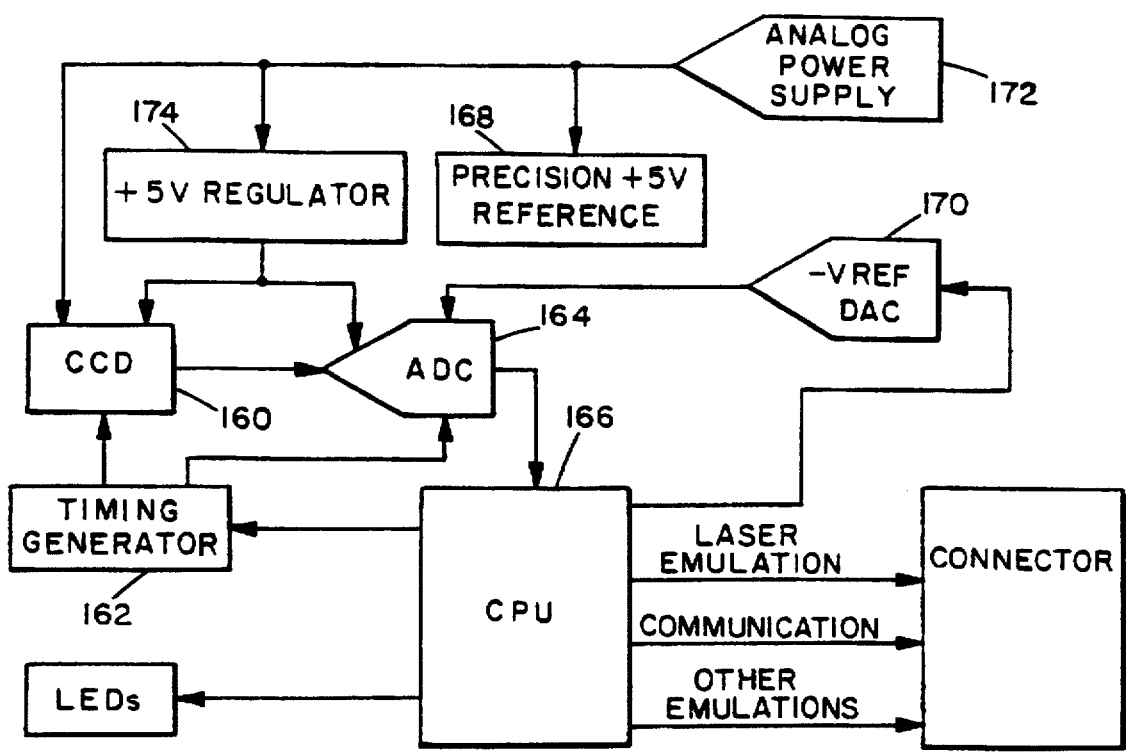

Now providing a more detailed description of an alternate embodiment, the scan sequence for which is illustrated in FIG. 12b, the optical scanning head will utilize a CCD linear image sensor array 160 for converting the bar code image into electrical impulses. In the exemplary embodiment, the image sensor is manufactured by Sony. The fixed lens assembly will focus the bar code image onto an M×N array of photo-sensitive sensitive sensors that accumulate an electric charge on those cells that are exposed to light. The brighter the illumination on a cell, the greater the charge accumulated over time. The sensor operates by transferring the accumulated charge in the sensor array to a charge-coupled device (CCD), which can be thought of as a shift register than can contain discrete analog voltage values. The contents of the CCD may be shifted out serially to the output pin of the device by clocking the CCD. As part of the clocking of the CCD, the charge in each CCD cell is transferred to an output stage. The charge in the output stage must be reset, otherwise the output stage would accumulate the charge from multiple pixels over time, in effect decreasing the resolution of the device.

A zero-programmable logic device is used to generate the clocks for the CCD and the A/D converter write pulse and A/D converter data latch clock. The zero-power GAL (generic logic array timing generator) 162 enters a near zero-power standby mode when the inputs of the device stop toggling. The CCD linear sensor array and the A/D converter 164 are operated in lock-step synchronization for optimum signal-to-noise characteristics.

Each pixel is comprised of two data samples. The first sample is the precharge voltage of the previous pixel in the CCD as it was being reset. This sample is made available when the external reset mode of the CCD is used, and the internal sample and hold in the CCD linear sensor is disabled. This is a sample of the low frequency noise level. The second sample is the actual pixel charge value. By subtracting the pixel charge value from the previous pixel precharge value, the low frequency noise can be effectively eliminated from the pixel signal.

Due to the limited number of product terms in the GAL 162, the state machine implemented in this GAL clocks the extraneous CCD precharge value in to the output data latch immediately after the READ GATE is fired. Thereafter, the first data value that becomes available is discarded. The next subsequent data value is the real precharge value, which will then be followed by the first dummy pixel from the CCD.

The timing generator 162 supports a special mode to rapidly dump and reset the contents of the CCD. When the CCDDUMP-signal is asserted, the CCD clock becomes a "divide by 2" of the input clock (446,836 Hz). It is assumed that the CCDDUMP-signal is also connected to the CCD EXSW input, so that when the CCDDUMP-value is a zero, EXSW is zero, putting the CCD into internal reset mode. In this was, the entire contents of the CCD may be reset in approximately 4.7 ms, compared to 37.347 ms for a normal read. Even faster reset times may be achieved by programming the timing generator clock output to be a higher frequency during the reset period.

Using this feature will allow the simulation of an electronic shutter with an adjustable exposure time between 4.7 ms ($\frac{1}{213}$ of a second) and 60 ms ($\frac{1}{16}$ of a second). Even longer exposure times may be programmed by delaying the read gate between scans. When in the CCDDUMP mode, no A/D conversions take place, and no data is latched.

The timing parameters for the Sony linear sensor arrays ILX-503/703 and the ILX-505 that were used in the exemplary embodiment are provided in Table 11.

TABLE 11

| | |
|---|---|
| CPU External Crystal Frequency | 19.6608 MHz |
| CPU Internal Clock Frequency | 9.8304 MHz |
| Timing Generator Clock Divisor | 11 |
| Timing Generator Clock | 893.67 KHz |
| CCD Clock Divisor (read) | 16 |
| CCD Clock Frequency (read) | 55.854 KHz |
| CCD Clock Divisor (dump) | 2 |
| CCD Clock Frequency (dump) | 446.84 KHz |
| ILX-503/703 Total CCD Cells | 2086 |
| Time required to read ILX-503/703 | 37.347 ms |
| Maximum scans/second (503/703) | 26 |
| Time required to dump ILX-503 | 4.668 ms |
| ILX-505 Total CCD cells | 2630 |
| Time required to read ILX-505 | 47.087 ms |
| Maximum scans/second (ILX-505) | 21 |
| Time required to dump ILX-505 | 5.885 ms |

The outputs of the timing generator are buffered to CMOS levels by an external 74HC368 Hex Driver. This tri-state device provides the necessary clocking drive that the CCD linear sensor array device requires. The analog SHUTDOWN signal will tri-state the outputs of the hex driver, further minimizing power consumption.

The microcontroller 166 controls the power to two LEDs connected in series for illumination of the bar code. In addition, the microcontroller 166 will be capable of controlling the power to the CCD sensor array 160 and analog circuitry. The microcontroller 166 may optionally control the power on an external interface board so that external interfaces may be shutdown when not required. For example, the microcontroller 166 is normally in a REST mode, where all system clocking has been stopped. The microcontroller 166 will then power up and immediately enter the bar code acquisition mode when the illumination enable input is asserted.

An 8-bit A/D converter 164 is used to convert the pulsed analog pixel and precharge voltages that are output by the linear sensor array. The multiple-sources AD0820A high-speed 8-bit A/D converter using a modified "flash" technique is operated in a stand-alone synchronous conversion mode, where the built-in track-and-hold amplifier is used to sample discrete pulses of analog voltage from the CCD linear sensor array. The track-and-hold amplifier will only sample during periods of time that the output of the CCD is stable, with a wide margin stable signal prior to and after sampling. In this way, all digital switching noise generated by the CCD will be completely eliminated from the sampled pixel and precharge output voltages.

The $V_{REF+}$ positive voltage reference input will be connected to the REF02+5V positive voltage reference 168. The $V_{REF-}$ negative voltage reference input will be adjustable under program control to maximize the sensitivity of the A/D converter 164. The $V_{REF-}$ Adjust reference 170 is implemented using a low cost D/A converter, specifically, a multiple-sourced AD7524 8-bit multiplying D/A converter. The AD7524 will be operated in a voltage mode by using the REF input as the output to an operational amplifier configured as a voltage follower with a gain of 2. The $I_{OUT}$ output is connected to a low impedance 2.5V voltage reference and acts as an input. This configuration allows the D/A converter to be operated from a single supply and produce a full-range output voltage swing, from 0 to the input reference voltage. Additional benefits are gained including low noise, low power, low cost, and low glitch.

The linear sensor arrays require two power supply voltages to operate. A 9V analog supply 172 is required plus a 5V timing and control power supply. The power supplies to the sensor arrays must be sequenced to prevent permanent latch-up. The 9V supply 172 must rise before the 5V supply, and the 5V supply must fall before the 9V supply. If the 9V supply is ever greater than 500 mV less than the 5V supply, permanent latch-up may occur. There is also concern about the signal degradation that may be incurred by utilizing a single +5V supply for both the analog and digital sections of the optical scanning head. High frequency digital noise injected into the power and ground planes may exceed the analog signal level, severely impacting the maximum resolution of the scanner.

To mitigate these potential problems, three separate power supplies are derived from the input +5V to the optical scanning head. The +9V supply is generated from the +5V input supply using a Linear Technology LT1111 Micropower DC-to-DC converter. The internal spar Op-Amp in the LT1111 is used as a post-regulator to minimize output ripple. A passive LC filter is also employed to reduce output ripple to a maximum of 2 mV. A TTL-compatible shutdown input is provided to the +9V supply through the use of a p-channel MOSFET high-side driver. When the shutdown input is driven above 4.5V, power to the LT111 is cut off, thereby shutting down the +9V supply. Quiescent current is limited to the leakage current from the Gate input of the MOSFET to the Drain output—approximately 100 nA.

The 9V supply provides a maximum of 140 mA of power. The +9V supply powers the sensor array, the $V_{OUT}$ transistor, a +5V band-gap reference voltage generator, and a +5V linear regulator 174.

The +5V reference voltage is generated by the industry standard REF02 band-gap voltage reference 168. The +5V voltage reference 168 is used for the $V_{REF+}$ voltage reference to the A/D converter 164, and as the voltage reference to the D/A converter 170. The +5V reference voltage is passed through a voltage divider network to derive a 2.5V reference input to an Op-Amp configured as a unity-gain follower. The output of the Op-Amp drives the D/A converter $I_{OUT}$, configuring the D/A converter 170 as a voltage output D/A converter. The Op-Amp $V_{CC}$ supply input is connected to the +5V reference supply, to minimize power-supply induced errors in the output.

An analog +5V supply is derived from the +9V supply with a Linear Technology LT1121-5 Micropower Low Dropout Regulator. The analog +5V supply is reverse-polarity shunted to the +9V analog supply by a low forward voltage Schottky barrier diode. The IN5817 diode has a forward voltage drop of 320 mV, well below the maximum 500 mV differential voltage that may cause the sensor array to permanently latch-up. The analog +5V supply powers the linear sensor array, the A/D converter, and the D/A converter.

The power supply grounds are split into 3 different ground nets. The digital ground plane is connected directly to the input ground pins on the optical scanning head connector. The +9V ground has a single-point connection to the input ground pins on the optical scanning head connector. The analog +5V ground has a single-point connection to the ground pin of the LT1121-5, which joins it to the +9V ground net. The separate routing and single-point ground net tie points are critical to minimizing coupling of digital ground noise throughout the analog section.

The decoder module 26 may be either inside or outside of the scanning head housing and will process the digitalized signal generated in the scanning head to calculate the desired data, e.g., the multiple digit representation or code represented by the bar code symbol in accordance with the algorithm contained in the software program. The decoder module includes a random access memory (RAM) for temporary data storage, and EPROM or PAL for holding the control program and a microprocessor which controls the RAM and EPROM or PAL. The decoder module will also include circuitry for controlling the scanning head and the communication circuitry for communication with different functions of the scanning head or with a host system to which the scanning head can be connected, such as a hand held terminal data screen personal computer for computer network.

A low battery detector 60 is included in the housing to provide an indication of insufficient power for further scans. This will provide advance warning so that the user will be aware of the problem before having scanned a number of items without realizing that the items cannot register properly due to the insufficient power.

An electronic shutter 116, shown in the block diagram of FIG. 16, is activated by the clock signal from clock 50 to periodically block the light impinging upon the detector 20. This creates "snapshots" of the bar code image to preserve the integrity of the bar code pattern signal as one of the scanning head and the bar code is in motion with respect to the other.

The circuitry, with or without the power supply of a portable configuration, of the optical scanner is protected within a housing 400 which is contoured to easily fit into the user's hand. The user will grip the housing 400 by its handle portion 402, illustrated in FIG. 4, with the window portion 404 aimed at the bar code symbol to be read. The trigger 406 is built within the handle 402 for easy, one-handed operation of the scanner, with the trigger 406 being positioned at a short distance from the user's fingers so that activation is simply a matter of depressing the trigger. A dual trigger, multi-position trigger or additional switch, is provided for selecting between one-dimensional and two-dimensional scanning, so that only as much power is used as is necessary to assure a high quality signal. An indicator lamp or LED 408 can be included to provide a visual signal of a "good read". Audio indicators may also be included. The window portion can be placed anywhere from 0 to 22 inches above or in front of the bar code to be scanned. With a scanning distance of less than seven inches, it is desirable to center the fan of light over the bar code since different intensities due to the sequential limitation of the LEDs may illuminate some portions of the bar code more brightly than others, and due to the higher density of light at the center of the fan. For scans greater than 22 inches, the LEDs can be replaced with a flash lamp.

The optical scanning head of the present invention provides a device for building a small or self-contained portable device, a portable component of a multi-component scanner, or the optical portion of a built-in scanning unit, for bar code scanning which uses LED and CCD technology making it an economical device. The scanning head is capable of reading bar codes up to 22 inches away from the detector with LED illumination and even more with a flash lamp, so that it is versatile for either portable or fixed implementation. The variably pulsed activation of the LEDs and CCD array, or the graduated illumination of the LEDs, makes the device capable of operating at low power with minimal power drain during illumination, a significant factor in portable scanners. The lens system and diverging beam of incoherent light produced by the LED array permit the reading of wide range of bar code densities and widths. For point-of-sale use, or industrial applications, where the scanner is fixed and the object imprinted with the bar code is moved past it, a number of optical scanning heads of the present invention can be used in combination and mounted at different angles so that, regardless of the orientation or position of the bar code, the bar code can be read. For example, a crossed or starburst pattern can be made by combining two or four scanning heads, respectively. The signal generated by each individual scanning head will be compared with signals from the other scanning heads, and the signal with the least error will be used. The signals from each scanning head may also be used to double check the signals provided by other scanning heads.

It is important to note that in this invention, an optimization of useful illumination from the LEDs is accomplished by a combination of focusing and diffusing the light to shape the beam to cover the field of view of the lens system. In the case of one-dimensional bar codes, it is a uniform linewidth of an extent which matches or overlaps the length of the bar code. In the case of two- or three- dimensional codes, it is a uniform circle, square or rectangle circumscribing the extent of the code in height and width.

It will be evident that there are additional embodiments which are not illustrated above but which are clearly within the scope and spirit of the present invention. The above description and drawings are therefore intended to be exemplary only and the scope of the invention is to be limited solely by the appended claims.

We claim:

1. An optical scanning device for reading a one- or two-dimensional symbology having a first width, said optical scanning device comprising:

at least one printed circuit board having a front edge with a second width;

a light source mounted on said at least one printed circuit board, said light source for projecting an incident beam of light onto said symbology, said incident beam of light having substantially said second width at said front edge of said at least one printed circuit board and a first height and a third width at said symbology, said third width being greater than said second width and at least as large as said first width:

an optical assembly comprising a plurality of lenses disposed on said at least one printed circuit board along an optical path for receiving and focusing light reflected from said framed symbology to obtain a focused light at a focal plane, said optical assembly having moving means for moving at least one of said plurality of lenses with respect to other lenses of said plurality to provide a variable field of view;

at least one framing means disposed on said at least one printed circuit board for framing said symbology to identify an area to be scanned by said scanner, wherein said at least one framing means comprises at least one laser diode for emitting a laser beam and at least one diffractive optic for transforming said laser beam into a plurality of diverging beamlets, said diverging beamlets having a beamlet spacing at said symbology at least as large as said first width, wherein said at least one framing means comprises a first framing means and a second framing means, the first framing means corresponding to a wide field of view and the second framing means corresponding to a narrow field of view;

a detector disposed on said at least one printed circuit board within said optical path substantially at said focal plane of said optical assembly for detecting at least a portion of said focused light within said variable field of view of said detector, said variable field of view having said first height and said third width, said detector for sensing said focused light to obtain a sensed symbology;

a processor for processing said sensed symbology to obtain an electrical signal; and an output means for converting said electrical signal into output data.

2. The optical scanning device recited in claim 1 further comprising a blocking means for blocking light from one of the first and second framing means in response to movement of a dual position zoom lens.

3. The optical scanning device recited in claim 2 wherein said blocking means comprises a movable louver having at least two louver positions, each louver position corresponding to one zoom position of said dual position zoom lens.

4. An optical scanning device for reading a one- or two-dimensional symbology having a first width, said optical scanning device comprising:

at least one printed circuit board having a front edge with a second width;

a light source mounted on said at least one printed circuit board, said light source for projecting an incident beam of light having a first wavelength onto said symbology, said incident beam of light having substantially said second width at said front edge of said at least one printed circuit board and a first height and a third width at said symbology, said third width being greater than said second width and at least as large as said first width;

an zoom lens assembly comprising a plurality of lenses disposed on said at least one printed circuit board along an optical path for receiving and focussing light reflected from said framed symbology to obtain a focussed light at a focal plane, said zoom lens assembly having moving means for moving at least one of said plurality of lenses with respect to other lenses of said plurality to provide a variable field of view, wherein said zoom lens assembly has two zoom positions, a first zoom position corresponding to a wide field of view and a second zoom position corresponding to a narrow field of view;

at least one framing means disposed on said at least one printed circuit board for framing said symbology to substantially frame an area to be scanned by said scanner, wherein said at least one framing means comprises at least one high purity light source for emitting a high purity beam having a second wavelength different from said first wavelength and at least one diffractive optic for transforming said high purity beam into a plurality of diverging beamlets, said diverging beamlets having a beamlet spacing at said symbology at least as large as said first width, wherein said at least one framing means comprises two sets of diffractive optical elements, a first set of diffractive optical elements for generating a first set of diverging beamlets for framing said wide field of view when said first zoom position is selected and a second set of diffractive optical elements for generating a second set of diverging beamlets for framing said narrow field of view when said second zoom lens position is selected;

a detector disposed on said at least one printed circuit board within said optical path substantially at said focal plane for detecting at least a portion of said focussed light within said variable field of view of said detector, said variable field of view having said first height and said third width, said detector for sensing said focused light to obtain a sensed symbology;

a processor for processing said sensed symbology to obtain an electrical signal; and an output means for converting said electrical signal into output data.

5. An optical scanning device as recited in claim 4 wherein said at least one framing means includes a blocking mask for blocking said first set of diverging beamlets when said second zoom lens position is selected and for blocking said second set of diverging beamlets when said first zoom lens position is selected.

* * * * *